(12) United States Patent
Gallagher

(10) Patent No.: US 11,404,633 B2
(45) Date of Patent: Aug. 2, 2022

(54) METHOD FOR FORMING MTJS WITH LITHOGRAPHY-VARIATION INDEPENDENT CRITICAL DIMENSION

(71) Applicant: Taiwan Semiconductor Manufacturing Co., Ltd., Hsin-Chu (TW)

(72) Inventor: William J. Gallagher, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/826,519

(22) Filed: Mar. 23, 2020

(65) Prior Publication Data

US 2021/0135098 A1  May 6, 2021

Related U.S. Application Data

(60) Provisional application No. 62/927,890, filed on Oct. 30, 2019.

(51) Int. Cl.
| | |
|---|---|
| *H01L 43/12* | (2006.01) |
| *H01L 21/033* | (2006.01) |
| *H01L 43/02* | (2006.01) |
| *H01L 27/22* | (2006.01) |
| *H01F 41/34* | (2006.01) |
| *H01F 10/32* | (2006.01) |

(52) U.S. Cl.
CPC ............. *H01L 43/12* (2013.01); *H01F 41/34* (2013.01); *H01L 21/0332* (2013.01); *H01L 27/222* (2013.01); *H01L 43/02* (2013.01); *H01F 10/329* (2013.01); *H01F 10/3254* (2013.01)

(58) Field of Classification Search
CPC .................................................. H01L 27/2409
See application file for complete search history.

(56) References Cited

U.S. PATENT DOCUMENTS

| | | | |
|---|---|---|---|
| 2011/0095257 A1* | 4/2011 | Xu | .................... H01L 21/02115 257/3 |
| 2020/0243124 A1* | 7/2020 | Bozdag | ................ G11C 11/161 |
| 2021/0296040 A1* | 9/2021 | Oguz | .................... G11C 11/161 |

OTHER PUBLICATIONS

Min et al. "Status and Outlook of STT-MRAM Development." Proc. of SPIE vol. 9167 91671B-1, published on Aug. 28, 2014.

(Continued)

*Primary Examiner* — Mounir S Amer
(74) *Attorney, Agent, or Firm* — Eschweiler & Potashnik, LLC

(57) ABSTRACT

Some examples relate to a method for forming a semiconductor device. The method comprises forming a pattern definition stack over a substrate, the pattern definition stack comprising a transfer layer, an interlayer arranged over the transfer layer, and a patterning layer arranged over the interlayer. The method further comprises forming a first opening in the patterning layer to expose an upper surface of the interlayer and etching the interlayer with an at least partially isotropic etchant through the first opening to form a recessed cavity. The method further comprises forming a conformal layer over the interlayer and the patterning layer to fill the first opening, and etching the conformal layer and the transfer layer with an anisotropic etch to form a second opening in the transfer layer. The method also comprises depositing a hard mask material in the second opening.

20 Claims, 27 Drawing Sheets

(56) References Cited

OTHER PUBLICATIONS

Gaidis et al. "Two-level BEOL Processing for Rapid Iteration in MRAM Development." IBM Journal of Research and Development (vol. 50, Issue: 1 , published Jan. 2006 ).
Breitwisch et al. "Novel Lithography-Independent Pore Phase Change Memory." 2007 Symposium on VLSI Technology Digest of Technical Papers, published on Oct. 8, 2007.
Bruce et al. "Directed Self-Assembly Patterning Strategies for Phase Change Memory Applications." SPIE Advanced Lithography, 2017, San Jose, California, United States, published on Mar. 21, 2017.

* cited by examiner

METHOD FOR FORMING MTJS WITH LITHOGRAPHY-VARIATION INDEPENDENT CRITICAL DIMENSION

REFERENCE TO RELATED APPLICATION

This application claims the benefit of U.S. Provisional Application No. 62/927,890, filed on Oct. 30, 2019, the contents of which are hereby incorporated by reference in their entirety.

BACKGROUND

Electronic memory is ubiquitous in modern electronic devices. In general, electronic memory allows the storage and read-out of information with electronic control and can be divided into volatile memory and non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory regarding power consumption, durability or scalability.

An MRAM cell for storing information includes a magnetic tunnel junction (MTJ) structure, and a resistance of the MTJ structure is adjustable to represent logic "0" or logic "1". The MTJ structure includes one magnetic reference layer and one ferromagnetic free layer separated by a tunneling insulating layer, typically termed a "tunnel junction". The resistance of the MTJ element is adjusted by changing a direction of the magnetization of the ferromagnetic free layer with respect to that of the reference layer. Depending on the relative alignment of the magnetization in the free layer and the reference layer, transmission of electrons through the tunnel junction is increased or decreased. The resulting low and high resistances are utilized to indicate a digital signal "0" or "1", thereby allowing for data storage and read out in an MRAM cell. As the information is encoded in the magnetization, it can be stored over long periods of time without expending electrical energy, allowing for devices having lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 14 illustrate a series of incremental manufacturing steps as a series of cross-sectional views.

DETAILED DESCRIPTION

Figure 1:
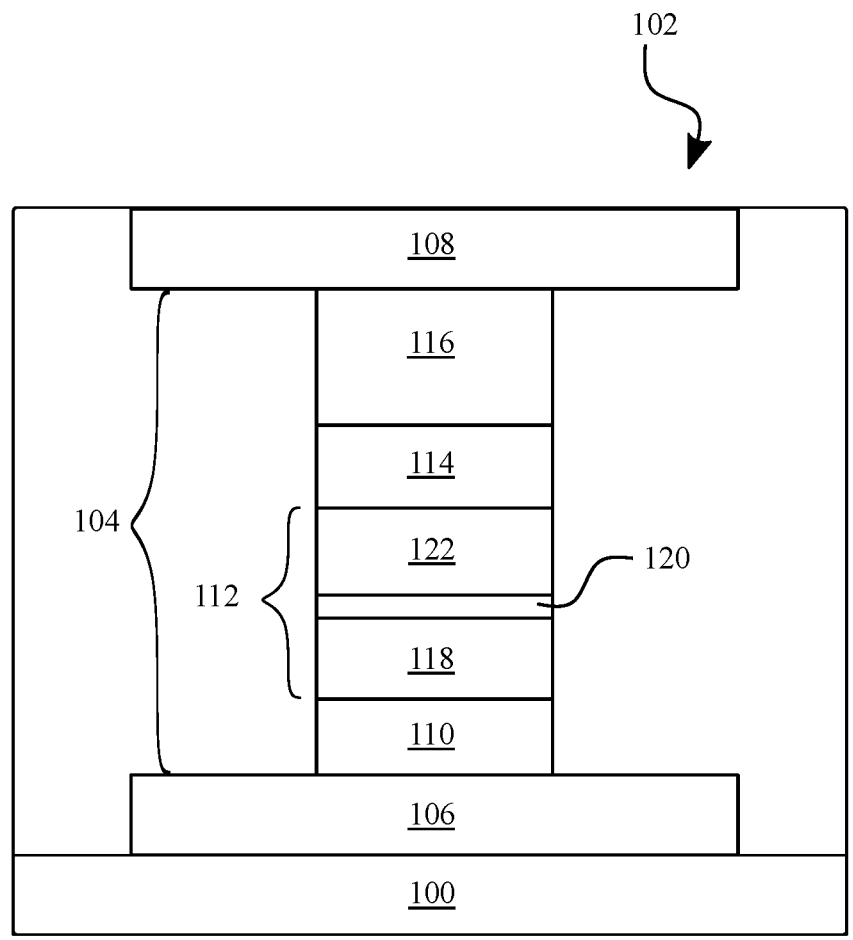
FIG. 1 illustrates a cross-sectional view of some examples of the magnetic cell part of an MRAM cell, including a magnetic tunnel junction (MTJ), according to the present disclosure.

The present disclosure provides many different examples for implementing different features of this disclosure. Specific examples of components and arrangements are described below to simplify the present disclosure. These are, of course, merely examples and are not intended to be limiting. For example, the formation of a first feature over or on a second feature in the description that follows may include examples in which the first and second features are formed in direct contact, and may also include examples in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various examples and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An MRAM magnetic cell in general includes a magnetic tunnel junction formed by a magnetic tunnel junction barrier layer featuring spin selective tunneling as well as a ferromagnetic free layer and a reference layer on opposite sides of the magnetic tunnel junction barrier layer. To write information to the MRAM magnetic cell, the direction of the magnetization of the ferromagnetic free layer may be adjusted by reorienting the direction of a magnetic moment of the ferromagnetic free layer. For example, in spin transfer torque (STT) MRAM cells, a writing process can be performed by applying a current through the tunnel junction of the MTJ structure, such that spin polarized electrons tunneling through or being reflected from the tunnel junction may impart a torque on a magnetic moment of the ferromagnetic free layer and thereby adjust its magnetization direction with respect to the reference layer. Similarly, a read-out process of the magnetoresistive state of the STT-MRAM may be performed by applying a current through the tunnel junction of the MTJ structure and monitoring the resulting voltage across the MTJ structure.

However, in the example of STT-MRAM the read-out process differs from the writing process mostly by the value of the injected current, such that a faulty read-out process may inadvertently affect the stored information. At the same time, the digital "1" and "0" states in MRAM cells generally differ by less than an order of magnitude, such that a fast and precise measurement is usually associated with lower limits for the detection current. Hence, robust and reliable operation of a plurality of MRAM cells in an MRAM memory commonly depends on precise control over the magnetoresistive properties for each of the plurality of MRAM cells during fabrication to minimize inadvertent information read errors during access.

In particular, as the magnetoresistance properties of the MTJ structure are largely proportional to an area of the tunnel junction, accurate control over the lateral dimensions of the MTJ structure is a desired property for a corresponding fabrication method. Common approaches for precisely defining miniaturized magnetoresistive elements include complex multi-patterning techniques, wherein lines of material with controllable width are arranged in a pattern above an MTJ material stack to define masking areas for subsequent etching steps. However, these approaches often include an extensive sequence of steps and can contribute adversely to the production effort for fabricating MRAM memory.

Examples described herein provide methods for fabricating semiconductor devices with controlled lateral dimensions to achieve robust and reliable operation of magnetoresistive memory devices. The method provides a precisely defined hard mask lateral shape for an MTJ structure associated with lithography-independent critical dimension variation. Further, examples of integrated circuits described herein include MTJ structures having corresponding shapes associated with low tunnel junction area variance.

FIG. 1 schematically illustrates a portion of an MRAM cell referred to as the MRAM magnetic cell 102 formed on a substrate 100. The MRAM magnetic cell 102 includes an MTJ structure 104 over a bottom electrical interconnection layer 106, and further includes a top electrical interconnection layer 108 over the MTJ structure 104. The top electrical interconnection layer 108 and bottom electrical interconnection layer 106 provide electrical connections to the MRAM magnetic cell 102, such as a bit line access and a source line access that are used to read or write a state of the MRAM magnetic cell 102. The MTJ structure 104 includes a bottom contact 110 over the bottom electrical interconnection layer 106, a magnetoresistive MTJ stack 112 over the bottom contact 110, a top contact 114 over the MTJ stack 112, and an MTJ cap 116 capping the MTJ structure 104.

The magnetoresistive MTJ stack 112 comprises a first magnetic interlayer 118 and a second magnetic interlayer 122 separated by a magnetic tunnel junction (MTJ) barrier layer 120. In some examples, the first magnetic interlayer 118 can have a fixed or "pinned" magnetic orientation, while the second magnetic interlayer 122 has a variable or "free" magnetic orientation, which can be switched between two or more distinct magnetic polarities that each represents a different data state, such as a different binary state. In other implementations, however, the MTJ structure 104 can be vertically "flipped", such that the first magnetic interlayer 118 has a "free" magnetic orientation, while the second magnetic interlayer 122 has a "pinned" magnetic orientation. The first magnetic interlayer 118 or the second magnetic interlayer 122 comprises a ferromagnetic layer comprising Fe, Co, Ni, FeCo, CoNi, CoFeB, FeB, FePt, FePd, or the like. The magnetic tunnel junction (MTJ) barrier layer 120 may comprise, for example, magnesium oxide (MgO), aluminum oxide (e.g., Al2O3), NiO, GdO, Ta2O5, MoO2, TiO2, WO2, or the like. To maximize a magnetoresistive effect in the MTJ structure 104 or a transfer of an electron or hole's magnetic moment across the magnetic tunnel junction barrier layer 120, the magnetic tunnel junction barrier layer 120 may be in direct contact with the first magnetic interlayer 118 and the second magnetic interlayer 122.

The first magnetic interlayer 118, the second magnetic interlayer 122, and the magnetic tunnel junction barrier layer 120 may respectively be formed using any suitable process, for example, by Physical Vapor Deposition (PVD), DC PVD, RF PVD, Chemical Vapor Deposition (CVD), Plasma Enhanced Chemical Vapor Deposition (PECVD), Atomic Layer Deposition (ALD), pulse DC, High-Density Plasma CVD (HDPCVD), low pressure CVD (LPCVD) or the like and may be formed in single or multiple layers. For example, the magnetic interlayer 118, 122 having a pinned magnetic orientation may comprise a first pinned magnetic layer and a second pinned magnetic layer, e.g. stacks of consecutive or alternating layers constituting first or second pinned magnetic layer stacks, separated by an antiferromagnetic coupling layer (not shown), such as ruthenium (Ru) or Iridium (Ir). The magnetic interlayer 118, 122 having the pinned magnetic orientation may then comprise a further magnetic "reference" layer adjacent to the magnetic tunnel junction barrier layer 120 and coupled to the first pinned magnetic layer or the second pinned magnetic layer.

The bottom contact 110 and the top contact 114 may comprise conductive layers, such as conductive metals, e.g. layers comprising Cu, Co, Ta, Pt, Ti, TiN, W, Ru, Mo, Cr or the like. The bottom contact 110 and the top contact 114 may provide electrical connections to the MTJ structure 104 via the top electrical interconnection layer 108 and the bottom electrical interconnection layer 106, respectively, such as to connect the MTJ structure to active or passive devices formed in or on the substrate 100.

Figure 2A:
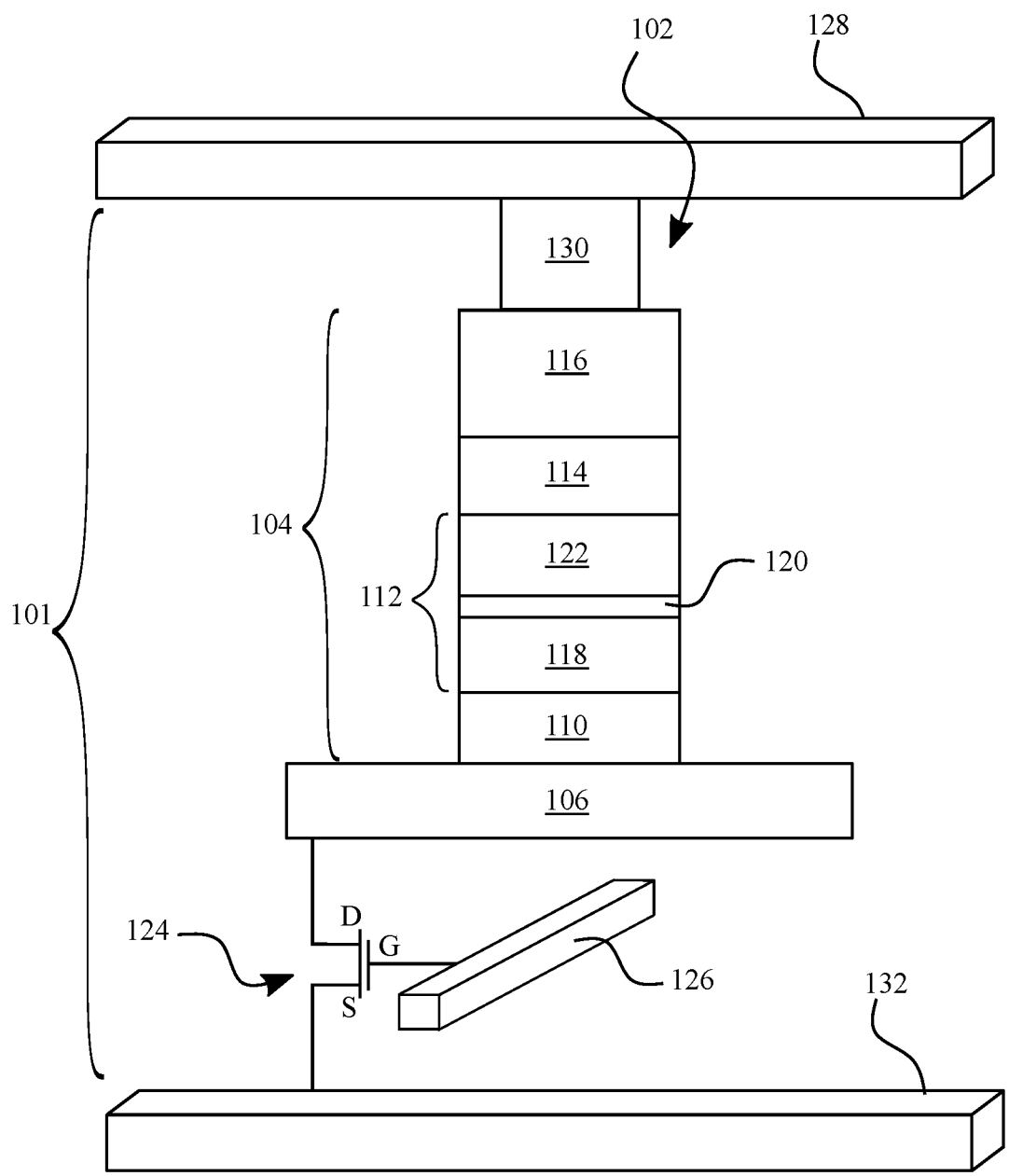
FIG. 2A, 2B illustrates schematic views of some examples of an integrated circuit including the magnetic cell part of an MRAM cell combined with one or more transistors, which function as a selector used for addressing the cell.

For example, as schematically illustrated in FIG. 2A, an MRAM cell 101 may comprise a transistor 124 and an MRAM magnetic cell 102. The bottom contact 110 of the MRAM magnetic cell 102 may be connected to a drain contact D of the transistor 124 through a bottom electrode interconnection layer 106, and a gate electrode G of the transistor 124 may be connected to a word line 126 of an MRAM memory via conductive interconnection layers in the substrate 100 (layers below layer 106 not explicitly shown). The top contact 114 of the MRAM cell 101 may be connected to a bit line 128 of the MRAM memory via a top electrode 130 of the MRAM cell 101. A source electrode S of transistor 124 may be connected to a source line 132. However, in some examples the transistor 124 may also be connected to the MTJ structure 104 via the top contact 114 and the bottom contact 110 may be connected to the bit line 128. The MRAM cell 101 may then be controlled in an STT-MRAM configuration by sending a current through the MTJ structure 104 via the bit line 128 and the source line 132, controlled by an electrical potential applied to the word line 126.

The schematically shown word line 126, bit line 128 or source line 132 may be conductive interconnects of conductive interconnection layers embedded in or formed on the substrate 100 or embedded in an insulating material, for example. The conductive interconnection layers may include patterned conductive layers and conductive vias extending perpendicularly through the substrate and connecting the patterned conductive layers. The metallic interconnection layers may further comprise an Inter-Metal Dielectric (IMD) or an Inter-Layer Dielectric (ILD), which may include a dielectric material having a low dielectric constant (k value) lower than 3.8, lower than about 3.0, or lower than about 2.5, for example. The insulating material may be formed of Phosphosilicate glass (PSG), Borosilicate glass (BSG), Borophosphosilicate glass (BPSG), Fluorosilicate glass (FSG), Tetraethyl orthosilicate (TEOS), hydrogenated silicon oxycarbide, a carbon-containing low-k dielectric material, Hydrogen silsesquioxane (HSQ), Methylsilsesquioxane (MSQ), or the like.

While the example in FIG. 2A is illustrated in an STT-MRAM configuration, the MTJ structure 104 according to examples of the disclosure may be applied to different MRAM configurations, such as magnetic field-based MRAM, spin hall effect (SHE) or spin orbit torque (SOT) based MRAM, electric field assisted/voltage controlled magnetic anisotropy (VCMA) MRAM, multi-level storage MRAM, or the like.

Figure 2B:
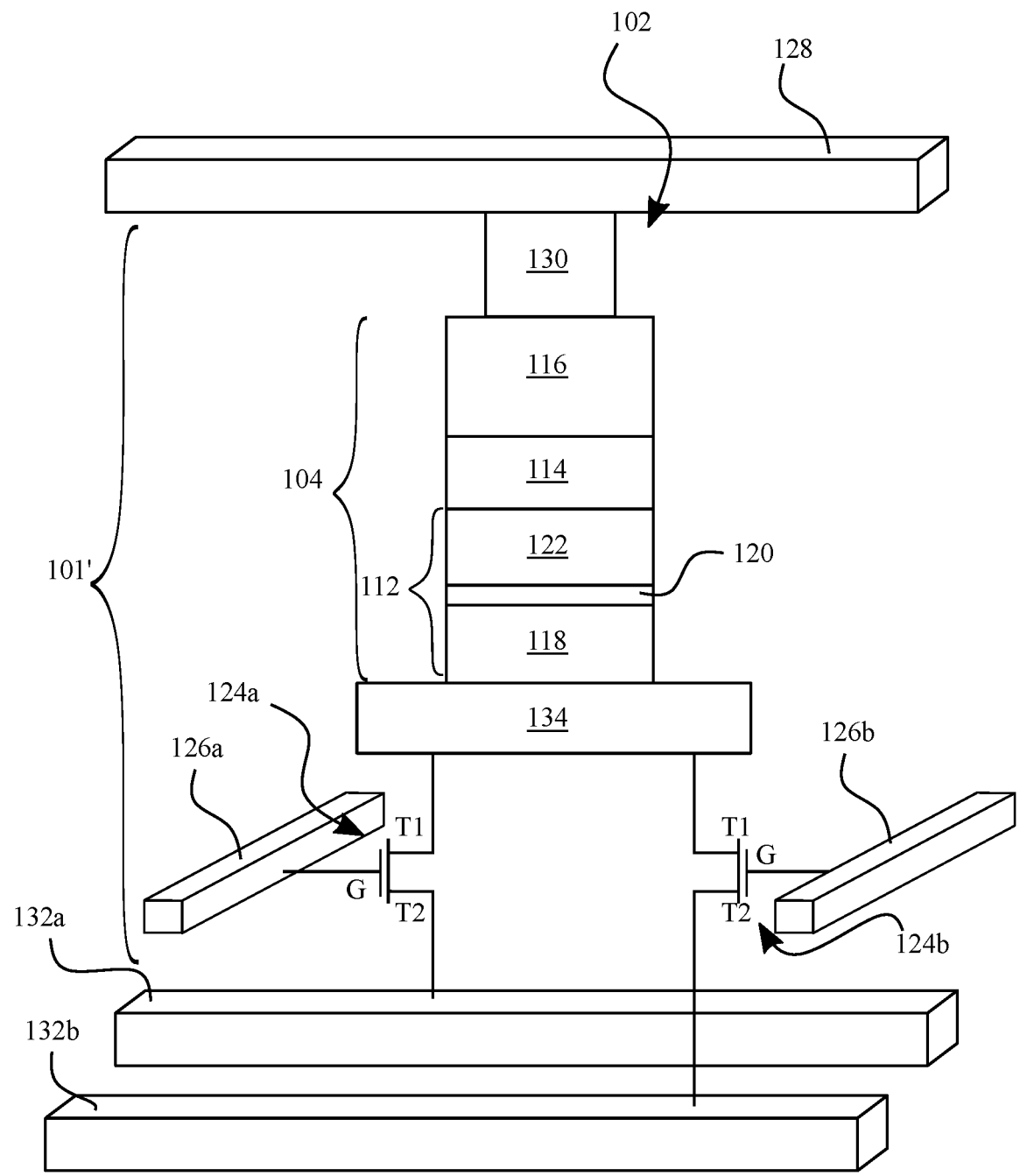

For example, FIG. 2B illustrates an example of an MRAM cell 101' in an SOT-MRAM configuration. The SOT MRAM magnetic cell 102 comprises an MTJ structure 104 formed on an SOT layer 134 with a magnetic interlayer 118 formed over the SOT layer 134 and the magnetic interlayer 118 may be configured as a magnetic free layer. A tunnel junction barrier layer 120 is formed over the first magnetic interlayer 118 and a second magnetic interlayer 122 is formed over the tunnel junction barrier layer 120 and configured as a magnetic reference layer/magnetic pinned layer. A bit line 128 is connected to the second magnetic interlayer 122 via a top electrode 130, a conductive cap 116, and a top contact 114.

The SOT layer 134 may be connected to a first terminal T2 of a first transistor 124a and a first terminal T2 of a second transistor 124b arranged on opposite sides of the SOT layer 134 with respect to the MTJ stack 112. A gate G of the first transistor 124a may be connected to a first word line 126a and a gate G of the second transistor 124b may be connected to a second word line 126b. A second terminal T2 of the first transistor 124a may be connected to a first source line 132a and a second terminal T2 of the second transistor 124b may be connected to a second source line 132b.

In the SOT-MRAM configuration, a writing process may be performed by sending a writing current through the SOT layer 134 from the first source line 132a to the second source line 132b. In the SOT layer 134 spin-orbit coupling may then lead to deflection of electrons of different spin in different directions, such that a magnetic moment direction change may be imparted on the first magnetic interlayer 118 which depends on the direction of the current through the SOT layer 134. As an example, the SOT layer 134 may comprise tungsten (W), tantalum (Ta), platinum (Pt) or an alloy or compound composition, such as AuPt, formed as a thin layer having a thickness of about 3 nm to about 20 nm, e.g. having a thickness between 4 to 6 nm, to give an example. In some examples, the SOT layer 134 is in direct contact with the first magnetic interlayer 118 or separated from the first magnetic interlayer 118 by a thin interlayer (not shown) which does not prevent transfer of electrons with their spin magnetic moments from the SOT layer 134 to the first magnetic interlayer 118.

The state of the MTJ structure may then be read by passing a current through the MTJ structure 104 from the bit line 128 to the first source line 132a or to the second source line 132b as discussed before with reference to the STT-MRAM configuration illustrated in FIG. 2A. Despite the writing current path being largely decoupled from the MTJ structure 104, a read-out process in the MRAM cell 101' in the SOT-configuration may still cause inadvertent magnetization switching due to the read current or there may be interference of the wrong memory state due to low read signal margin, such that accurate control over the lateral dimensions of the MTJ structure 104 remains a desired property for a fabrication method of an MRAM cell 101' in an SOT-MRAM configuration, or other MRAM configurations.

A plurality of MRAM magnetic cells 102 as shown in FIG. 1, 2A or 2B may be arranged over the substrate 100 in rows and columns, e.g. on a square or hexagonal lattice, which rows and columns may be associated with respective word lines 126 and bit lines 128 to form an array of the MRAM memory. To selectively read or write a state of the MRAM cell 101, 101' in the MRAM memory, appropriate electrical potentials may be concurrently applied to the source line 132 and to a respective pair of a word line 126 and a bit line 128 corresponding to a certain MRAM magnetic cell 102. These electrical potentials may be selected such that a resulting current for reliably reading the state of the MRAM magnetic cell 102 does not inadvertently switch a magnetization of the ferromagnetic free layer. Hence, the magnetoresistive properties of the MTJ structure 104 of the MRAM cell 101, 101' should be accurately controlled during a fabrication process in order to avoid unreliable reading and simultaneously to limit inadvertent switching of magnetization due to falsely or inappropriately selected electrical potentials.

For that purpose, the layers of the MTJ structure 104 may be formed consecutively one over the other. Then a lateral dimension of the MTJ structure 104 and in particular the lateral area of the MTJ stack 112 at or close to the magnetic tunnel junction barrier layer 120 may be defined by etching the sequence of layers with a hard mask having a well-defined lateral dimension. In particular, the mask may be formed to define an intended critical dimension of the MTJ structure 104, such as a diameter or a width of the MTJ structure 104. The resulting structure may then be a pillar-shaped MTJ structure 104 capped by the hard mask, which may serve as the MTJ cap 116, and having a contour corresponding to the contour of the hard mask associated with the critical dimension.

FIGS. 3 through 14 illustrate intermediate stages of the creation of an MTJ structure 104 in accordance with some examples. FIG. 3 illustrates providing a substrate 100.

The substrate 100 may be formed of a semiconductor or insulating substrate, such as a silicon substrate a silicon germanium substrate or a silicon on insulator (SOI) substrate, or the like. In some examples, the substrate 100 is a crystalline semiconductor substrate such as a crystalline silicon substrate, a crystalline silicon carbon substrate, a crystalline silicon germanium substrate, a III-V compound semiconductor substrate, or the like. In an example, the substrate 100 may comprise bulk silicon, doped or undoped, or an active layer of a silicon-on-insulator (SOI) substrate. Generally, an SOI substrate comprises a layer of a semiconductor material such as silicon, germanium, silicon germanium, or combinations thereof, such as silicon germanium on insulator (SGOI). Other substrates that may be used include multi-layered substrates, gradient substrates, or hybrid orientation substrates.

In some examples, the substrate 100 may be processed to include conductive features, such as active and passive devices, and conductive interconnection layers. The conductive interconnection layers of the substrate 100 may comprise the bottom electrical interconnection layer 106 and may provide electrical connections to active devices, passive devices or to the bottom contact 110 of the previously illustrated MRAM magnetic cell 102 or a combination thereof.

Figure 4A:
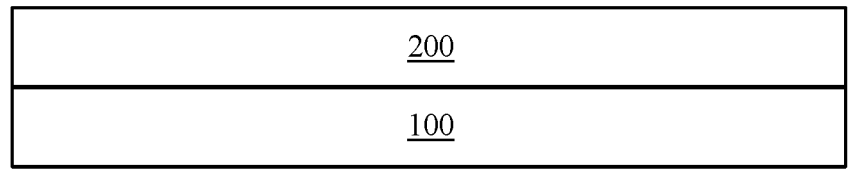

In FIG. 4A an MTJ layer stack 200 is formed over the substrate 100. The MTJ layer stack 200 comprises an insulating layer for a tunnel junction barrier layer 120 and a plurality of magnetic layers to form the first magnetic interlayer 118 and the second magnetic interlayer 122. In addition, the MTJ layer stack 200 may comprise additional layers to control the magnetoresistive properties of the MTJ layer stack 200 as well as the texture and anisotropy of the layers.

Figure 4B:
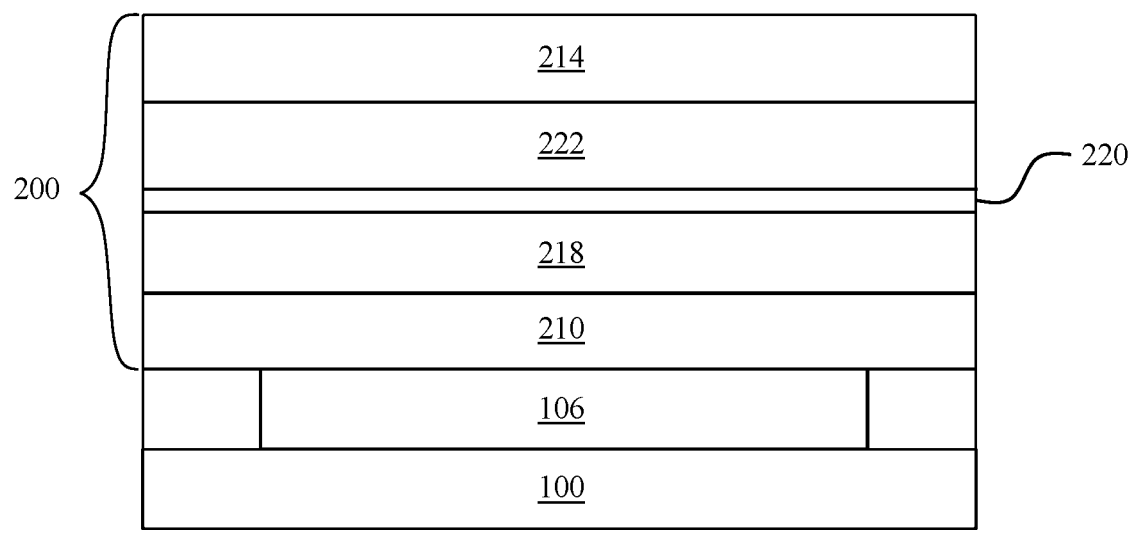

As shown in FIG. 4B, forming the MTJ layer stack 200 may comprise forming a bottom contact layer 210 over the substrate 100 having formed therein a bottom electrical interconnection layer 106. The magnetoresistive portion of the MTJ layer stack 200 is then formed by forming a first magnetic interlayer 218 over the bottom contact layer 210, forming a tunnel junction barrier layer 220 over the first magnetic interlayer 218 and forming a second magnetic interlayer 222 over the tunnel junction barrier layer 220. The MTJ layer stack 200 may then be capped by a top contact layer 214 over the second magnetic interlayer 222. It will however be appreciated that in practice, each of the layers illustrated in FIG. 4B may be subdivided into a plurality of different layers formed one over the other.

Figure 4C:
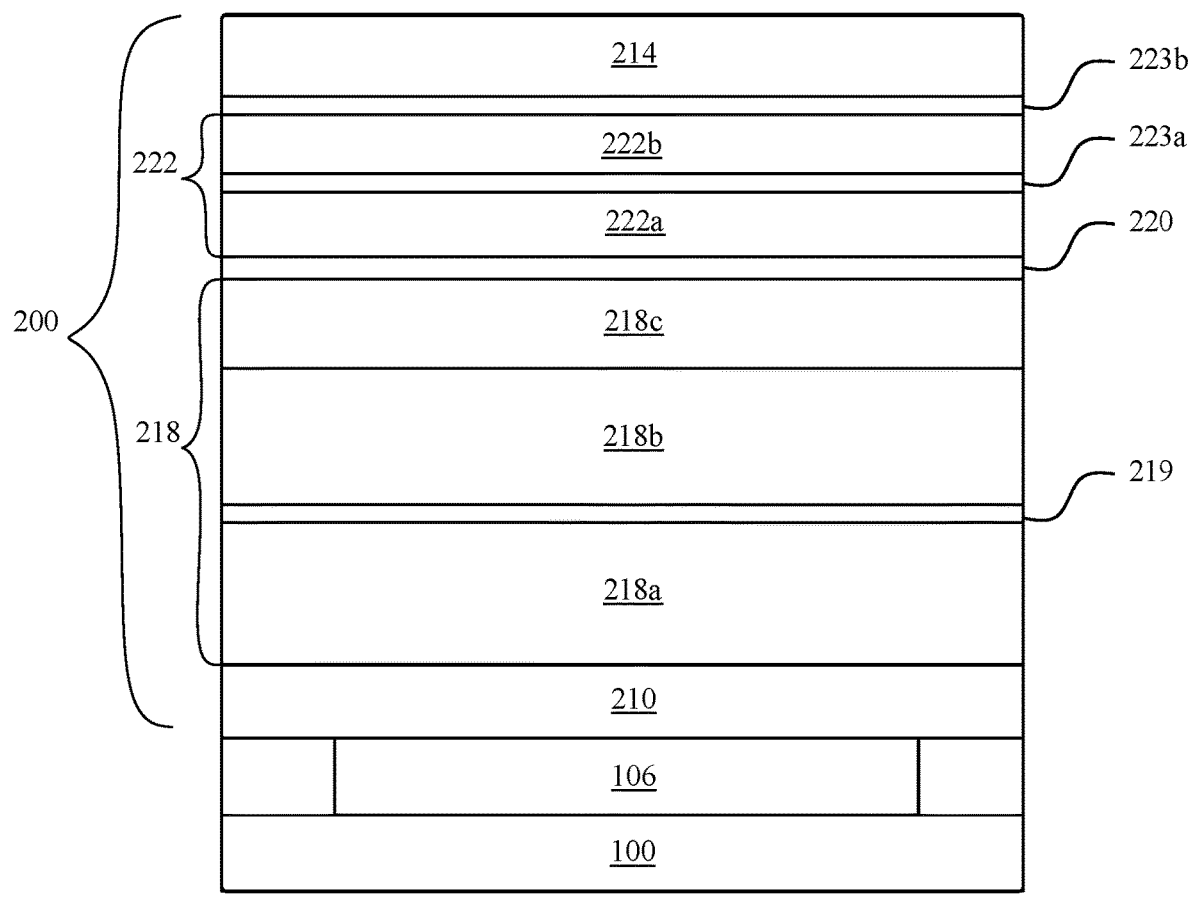

For example, in FIG. 4C an example of an MTJ layer stack 200 for forming an STT-MRAM cell 101 is illustrated. The MTJ layer stack 200 comprises a bottom contact layer 210 which may be formed of conductive materials, such as metals, to electrically connect the MTJ structure 104 to the bottom electrical interconnection layer 106. The bottom contact layer 210 may further comprise smoothing or seed layers for smoothing a surface of the underlying substrate 100 or bottom electrical interconnection layer 106 or seeding a respective crystallographic orientation of overlying layers. For example, the bottom contact layer 210 may comprise a layer of platinum in a crystallographic (111) orientation arranged over a layer of tungsten, or tantalum, and may be formed by any appropriate metal deposition process to a thickness between about 5 nm and about 20 nm although other thicknesses may be used.

A first magnetic interlayer 218 may be formed over the bottom contact layer 210 and may comprise a first portion 218a, a second portion 218b and a third portion 218c of magnetic material layers. The first portion 218a and the second portion 218b may be separated by an antiferromagnetic coupling layer 219 and may form a synthetic antiferromagnet (SAF). As an example, the first portion 218a and the second portion 218b may comprise a sequence of stacked layers comprising platinum and cobalt in a crystallographic (111) orientation and may be separated by an antiferromagnetic coupling layer 219 comprising ruthenium or iridium to form a synthetic antiferromagnet with a perpendicular magnetization direction, i.e. wherein the direction of magnetization associated with the portions 218a, 218b of the synthetic antiferromagnet is oriented perpendicular with respect to the substrate 100.

A third portion 218c may then be arranged over the second portion 218b to act as a pinned magnetic reference layer for the MTJ layer stack 200. The third portion may comprise a ferromagnetic material alloy such as cobalt iron (CoFe), nickel iron (NiFe), cobalt iron boron (CoFeB), cobalt iron boron tungsten (CoFeBW), or the like, and may contain the same or different magnetic materials as the first portion 218a or the second portion 218b. Further, the third portion 218c may have the same or a different crystallographic orientation as the first portion 218a or the second portion 218b. For example, the third portion may comprise a layer of CoFeB having a crystallographic (100) orientation and may be separated from the second portion 218b by a texture breaking layer (not shown), such as a layer of tantalum, molybdenum, or tungsten. In some examples, a net magnetization of the first portion 218a, the second portion 218b and the third portion 218c is zero or close to zero.

The magnetic tunnel junction barrier layer 220 may comprise magnesium oxide (MgO) and may be formed over the third portion 218c to a thickness of between about 0.5 nm and about 3.5 nm thick, such as about 1.5 nm thick, to form an insulating tunnel barrier between the first magnetic interlayer 218 in the second magnetic interlayer 222. The magnetic tunnel junction barrier layer 220 should be thin enough that electrons are able to tunnel through the magnetic tunnel junction barrier layer 220 when a biasing voltage is applied across the MTJ structure 104.

The second magnetic interlayer 222 should be formed over the magnetic tunnel junction barrier layer 220 and may comprise a first portion 222a and a second portion 222b which may be separated by a texture or interface anisotropy inducing layer 223a. The first portion 222a and the second portion 222b may comprise the same or different layers and may each comprise a ferromagnetic material alloy such as cobalt iron (CoFe), nickel iron (NiFe), cobalt iron boron (CoFeB), cobalt iron boron tungsten (CoFeBW), or the like. As an example each of the first portion 222a and the second portion 222b may be formed of layers of CoFeB having a crystallographic (100) orientation and may be formed to a thickness of about 1-2 nm. The first portion 222a and the second portion 222b may be separated by a layer of tantalum as an example of the texture or interface anisotropy inducing layer 223a. The second magnetic interlayer 222 may be capped by an interface anisotropy inducing layer 223b, such as a magnesium oxide interlayer. The top contact 214 may then conductively cap the second magnetic interlayer 222 with metallic layers, such as Ta, W, Ru, Mo, or the like, and may be electrically connected to the second magnetic interlayer 222, wherein the connection may be through the interface anisotropy inducing layer 223b.

However, it will be appreciated that the example of FIG. 4C is illustrative and is not intended to imply any limitation. For example, while in FIG. 4C, the first magnetic interlayer 218 comprises a pinned magnetic layer and the second magnetic interlayer 222 comprise a free magnetic layer, the structure may equally be flipped, and other material choices for the contact materials, magnetic materials, insulating barriers, coupling materials and texture or anisotropy inducing/breaking layers and their respective arrangement may be selected. Further instead of a synthetic antiferromagnet formed by the first and second portions 218a, 218b, an antiferromagnetic layer may be deposited adjacent to the pinned magnetic reference layer, such as a metal alloy including manganese (Mn) and another metal(s) such as platinum (Pt), iridium (Jr), ruthenium (Ru), rhodium (Rh), nickel (Ni), palladium (Pd), iron (Fe), osmium (Os), or the like.

Figure 5:
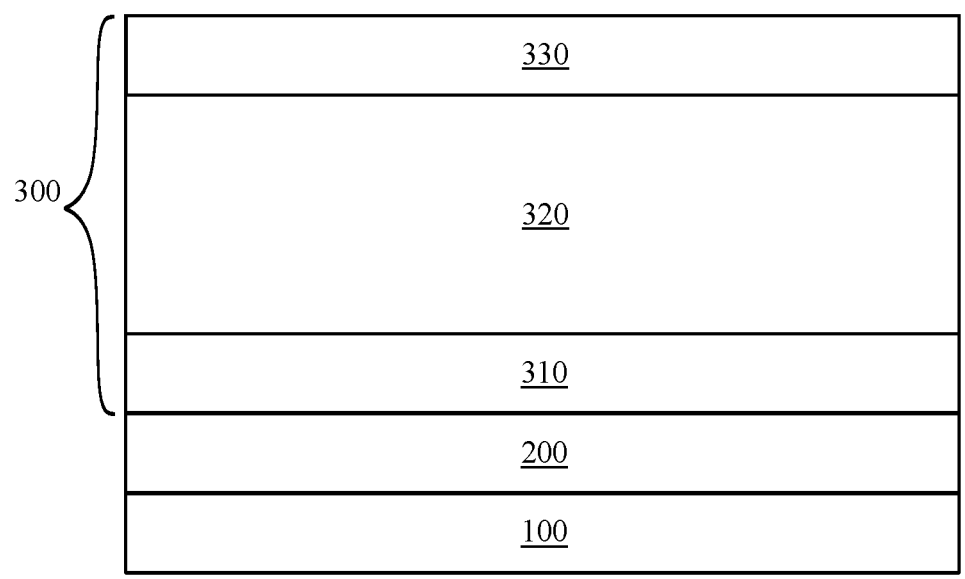

FIG. 5 illustrates forming a pattern definition stack 300 over the substrate 100 with the MTJ layer stack 200 (shown schematically as a single layer). The pattern definition stack 300 comprises a transfer layer 310, an interlayer 320 arranged over the transfer layer 310, and a patterning layer 330 arranged over the interlayer 320.

The patterning layer 330 and the interlayer 320 should comprise different materials, such that the interlayer 320 may be selectively etched with a higher etch rate than the patterning layer 330. In some examples, the patterning layer 330 comprises a hard mask material for processing the interlayer 320. The patterning layer 330 may comprise a nitride, such as silicon nitride, titanium nitride, tantalum nitride, or the like. In some examples, the patterning layer 330 may be made of a composition which includes tantalum, tungsten, chromium, ruthenium, molybdenum, silicon, germanium, or combinations thereof, as well as nitrides and/or oxides of these materials. The patterning layer 330 may be formed using any suitable process, for example, by Physical vapor deposition (PVD), DC PVD, RF PVD, Chemical Vapor Deposition (CVD), Plasma Enhanced Chemical Vapor Deposition (PECVD), Atomic Layer Deposition (ALD), pulse DC, High-Density Plasma CVD (HDPCVD), low pressure CVD (LPCVD) or the like, to a thickness between about 10 nm and 50 nm, though other thicknesses may be used.

Accordingly, the materials of the interlayer 320 may be selected to be uniformly formed and to be etched selectively with a higher etch rate than the material of the patterning layer 330 by a well-controlled isotropic etchant. For example, the patterning layer 330 may comprise polysilicon (Si) and the interlayer 320 may comprise silicon oxide ($SiO_x$), in which case a buffered HF solution can be used to provide the desired selective etch. In some examples, the patterning layer 330 may comprise silicon nitride (SiN) in which case a suitable concentration of a buffered HF solution can be used to provide a selective etch. The interlayer 320 may be formed using any suitable process, for example, by PVD, RF PVD, CVD, PECVD, ALD, pulse DC, or the like, to a thickness which may be larger than the critical dimension of the MTJ structure 104, such as between about 60 nm and 300 nm, though other thicknesses may be used depending on the intended scale of the MTJ structure 104.

The transfer layer 310 should be different from the interlayer 320 and may be different from the patterning layer 330. In some examples, the transfer layer 310 functions as an etch stop layer with respect to the interlayer 320. Accordingly, the transfer layer 310 may include metal or semiconductor material, such as an oxide, nitride, or carbide of a metal or semiconductor material different from the interlayer 320 and resistant to an etchant of the interlayer 320. Such materials may include, for example, silicon nitride, aluminum nitride, aluminum oxide, silicon carbide, silicon carbide, and the like. The transfer layer 310 may include multiple layers of the same or different materials. The transfer layer 310 may be formed by any suitable method, such as by PECVD or other methods such as HDPCVD, ALD, LPCVD, PVD, and the like to a thickness between about 20 nm and 60 nm, though other thicknesses may be used.

In some examples, the transfer layer 310 comprises the same material as the patterning layer 330. For example, the patterning layer 330 and the transfer layer 310 may comprise silicon nitride or polysilicon, whereas the interlayer 320 comprises silicon oxide.

Figure 6:
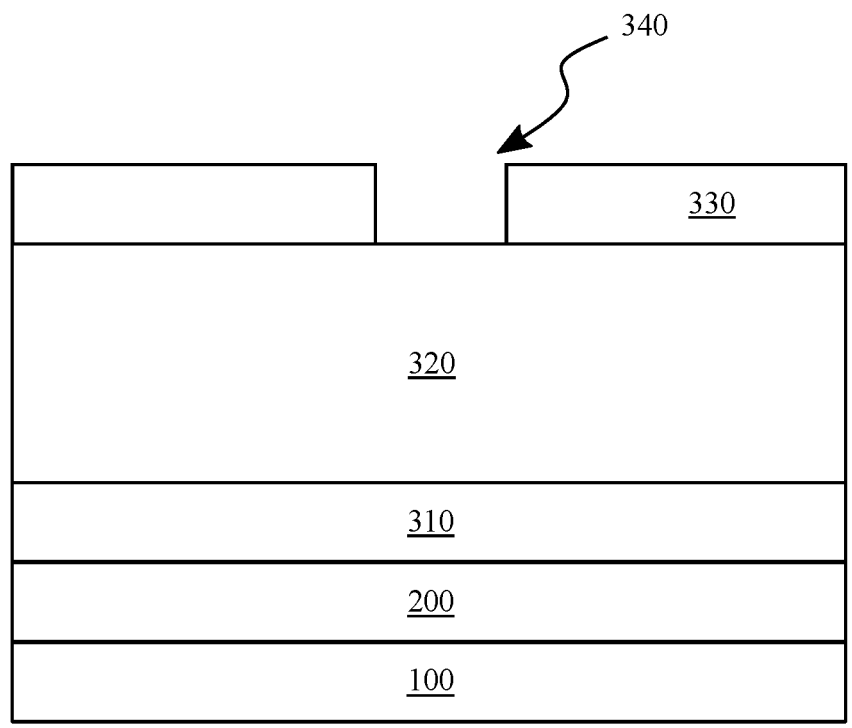

FIG. 6 illustrates forming a first opening 340 in the patterning layer 330 to expose an upper surface of the interlayer 320. The first opening 340 may be formed by any suitable method. For example, the first opening 340 may be formed by a photo-patterning process, using a patterned photo resist (not shown). The patterning layer 330 may then be etched to transfer a pattern of the patterned photoresist to the patterning layer 330 and to expose the upper surface of the interlayer 320. The patterned photoresist may be removed after exposing the upper surface of the interlayer 320 or may remain on top of the patterning layer 330 to process the interlayer 320.

The first opening 340 may have a lateral dimension (width) larger than the intended critical dimension of the MTJ structure 104. In some examples, the first opening 340 has a circular shape and a diameter of the first opening 340 is larger than the intended critical dimension, such as a diameter of the MTJ structure 104. For example, a lateral dimension of the first opening 340 may be between about 30 nm to about 300 nm, or a ratio of the lateral dimension of the first opening 340 and the intended critical dimension may be between about 1.5 and about 10.

Figure 7:
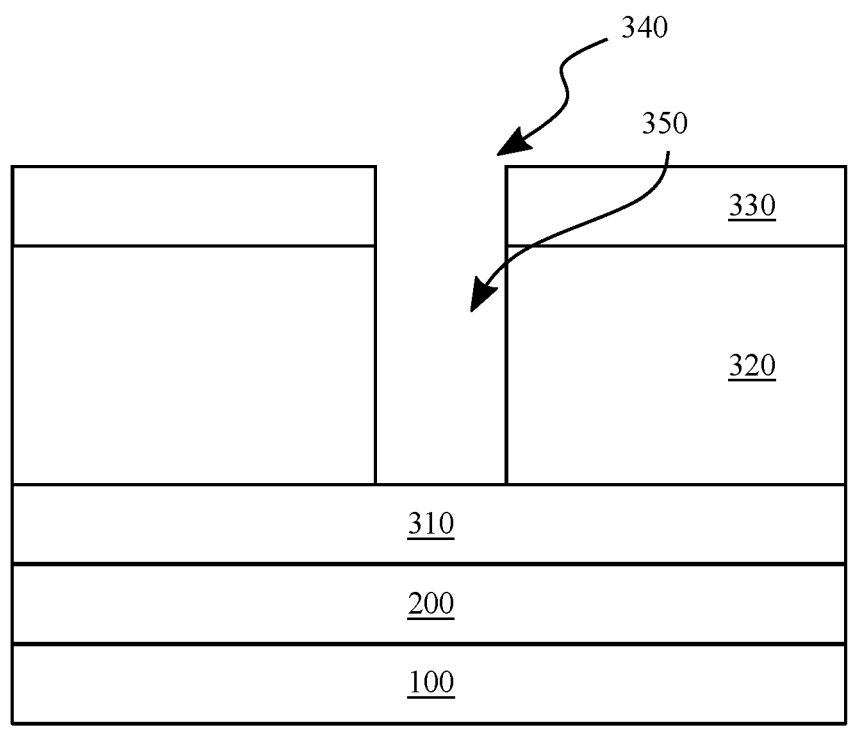

FIG. 7 illustrates forming a cavity 350 in the interlayer 320 through the first opening 340. In some examples, the cavity 350 and the first opening 340 are formed consecutively using the patterned photoresist (not shown). For example, an etchant may be used to consecutively etch the patterning layer 330 according to a pattern in the patterned photoresist and the interlayer 320 through the patterned photoresist and the first opening 340. However, the patterned photoresist may also be removed after forming the first opening 340, and the cavity 350 in the interlayer 320 may be formed by etching the interlayer through the first opening 340.

In some examples, etching the interlayer 320 may comprise anisotropically etching the interlayer 320 through the first opening 340 to form a cylindrical cavity 350 extending into the interlayer 320. Hence, a shape of the first opening 340, such as the circular shape discussed above, may be transferred into the interlayer 320. The cylindrical cavity 350 may extend vertically into the interlayer 320, i.e. substantially perpendicularly with respect to the substrate 100. For example, the interlayer 320 may be etched with an anisotropic reactive ion etch (RIE) process or similar dry etch process to form a high aspect ratio hole or a plurality of holes in the interlayer 320. Depending on the aspect ratio produced by the anisotropic etch, the cylindrical cavity 350 extending vertically into the interlayer 320 may also be slightly cone-shaped but still be considered a cylindrical cavity 350 according to the present disclosure.

A depth of the cavity 350 into the interlayer 320 along the vertical direction may be larger than the intended critical dimension of the MTJ structure 304 along a lateral direction. For example, the interlayer 320 may be thicker than the intended critical dimension, e.g. a width of the MTJ structure 104, and the cavity 350 may expose an upper surface of the transfer layer 310, as illustrated in FIG. 7.

Figure 8:
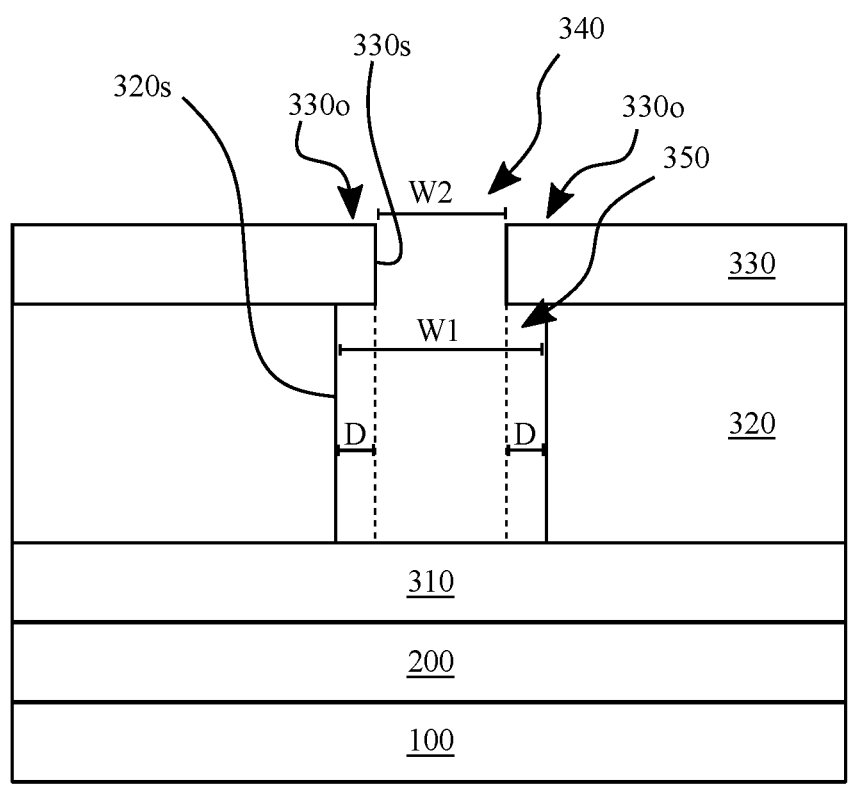

FIG. 8 illustrates forming a recessed cavity 350 in the interlayer 320 recessed with respect to the patterning layer 330. In the recessed cavity 350, a lateral surface 320s of the interlayer 320 in the cavity 350 is recessed with respect to a lateral surface 330s of the patterning layer 330 in the first opening 340 to a recess depth D. In other words, an overhanging portion 330o of the patterning layer 330 may overhang the cavity 350 by the recess depth D, such that a width W1 of the cavity 350 may differ from a width W2 of the first opening 340 by twice the recess depth D.

The recessed cavity 350 may be obtained by etching the interlayer 320 with an at least partially isotropic etchant through the first opening 340, wherein an etch rate of the at least partially isotropic etchant for the interlayer 320 is higher than an etch rate for the transfer layer 310 and the patterning layer 330. The interlayer 320 may be etched with a selective isotropic etch, such as a wet etch, vapor etch or isotropic plasma etch. For example, the interlayer 320 may comprise an oxide, e.g. silicon oxide, and the patterning layer 330 may comprise polysilicon. A selective isotropic etch may comprise an oxide etch, e.g. hydrofluoric acid in vaporous, liquid, buffered, or diluted form, selected to negligibly etch the patterning layer 330 with respect to the interlayer 320 during the etching of the interlayer 320 with the at least partially isotropic etchant. Alternatively, the patterning layer 330 may comprise a silicon nitride layer while the interlayer 320 comprises silicon oxide with the isotropic wet etchant comprising a hydrofluoric (HF) acid-based solution with a pH adjusted to much more rapidly etch silicon oxide than it etches silicon nitride.

In some examples, the interlayer 320 is etched with the at least partially isotropic etchant through the first opening 340 to obtain a recess depth D corresponding to twice the intended critical dimension for the MTJ structure 104.

Figure 9:
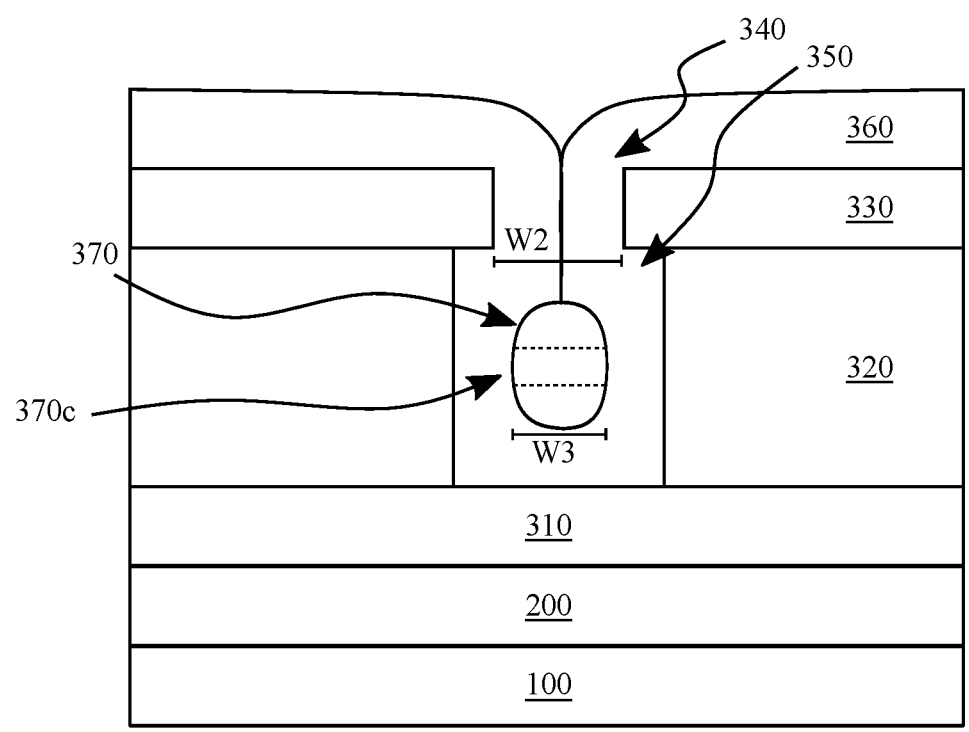

In FIG. 9, a conformal layer 360 is formed over the interlayer 320 and the patterning layer 330 to fill the first opening 340. The conformal layer 360 may be formed of any material with a suitable homogenous conformal deposition process, which may conformally be deposited within the cavity 350 with a uniformly deposited thickness. For example, the homogenous conformal deposition process may be an ALD, CVD or similar process that deposits a layer of material with uniform thickness on exposed surfaces of the interlayer 320 and the patterning layer 330. In some examples, the conformal layer comprises silicon, such as polysilicon, deposited conformally over the exposed surfaces of the interlayer 320 and the patterning layer 330.

As illustrated in FIG. 9, the conformal layer 360 fills the first opening 340 and leaves a pore 370 arranged between an upper surface of the patterning layer 330 and an upper surface of the transfer layer 310. As the first opening 340 is filled by the conformal layer 360, portions of the conformal layer 360 deposited on opposite lateral surfaces of the patterning layer 330 merge and the inner surfaces of the cavity 350 are no longer exposed, such that further deposition of the conformal layer 360 in the space occupied by the pore 370 is prevented. The width W3 of the pore 370 may then correspond to a difference between the width W1 of the cavity 350 and the width W2 of the first opening 340. As the conformal layer 360 merges, the transport of material through the shrinking first opening 340 will be reduced such than the merger of the surfaces may be complete near the top side of the merging films but incomplete closer to the bottom side of the cavity 350, leaving a small gap near the bottom. In other words, a gap in the merger below a pinched-off section may be formed with a shape like that of an inverted cone (not illustrated).

In some examples, the pore 370 comprises a cylindrical pore segment 370c, wherein the width W3 of the pore 370 is constant or substantially constant over a vertical height of the cylindrical pore segment 370c. A conformal deposition generally smoothes edges, such that the pore 370 may have a contour corresponding to a rounded contour of the recessed cavity 350. A cylindrical segment 370c of the pore 370 may be obtained by first anisotropically etching the interlayer through the first opening 340 to form a cylindrical cavity 350 in the interlayer 320 before isotropically etching the interlayer 320 and forming the conformal layer 360. Isotropically etching the interlayer 320 and forming the conformal layer 360 may preserve the shape of the cylindrical cavity 350, such that the contour of the cylindrical cavity 350 may be transferred to the pore 370 in a central cylindrical segment 370c. To transfer the shape of the cylindrical cavity 350 to the pore 370, when forming the conformal layer 360, the interlayer 320 may be formed with a thickness greater than twice the recess depth D, such that the pore 370 assumes a vertically elongated shape when the first opening 340 is filled with the conformal layer 360. The central cylindrical segment 370c may then be primarily formed by portions of the conformal layer 360 conformally grown on the interlayer 320, as opposed to conformally grown on the patterning layer 330 or the transfer layer 310.

The cylindrical pore segment 370c may have a circular shape induced by the shape of the first opening 340 or may have a rounded shape corresponding to a shape of the first opening 340 with edges rounded by the conformal deposition of the conformal layer 360. As the deposition of the conformal layer 360 rounds the edges of the contour of the recessed cavity 350 when forming the pore 370, a contour of the pore 370 may approach a circular shape independently of the contour of the cavity 350 for increasing thickness of the conformal layer 360. As an example, when a conformal layer 360 is formed in a cavity 350 having a square contour, edges of the initially square contour may be rounded by merging portions of the conformal layer 360, eventually approaching a circular contour. Hence, to minimize a variation of the shape of the contour of the pore 370 during isotropic etching of the interlayer 320 or forming the conformal layer 360, the first opening 340 may be formed with a circular shape.

Figure 10:
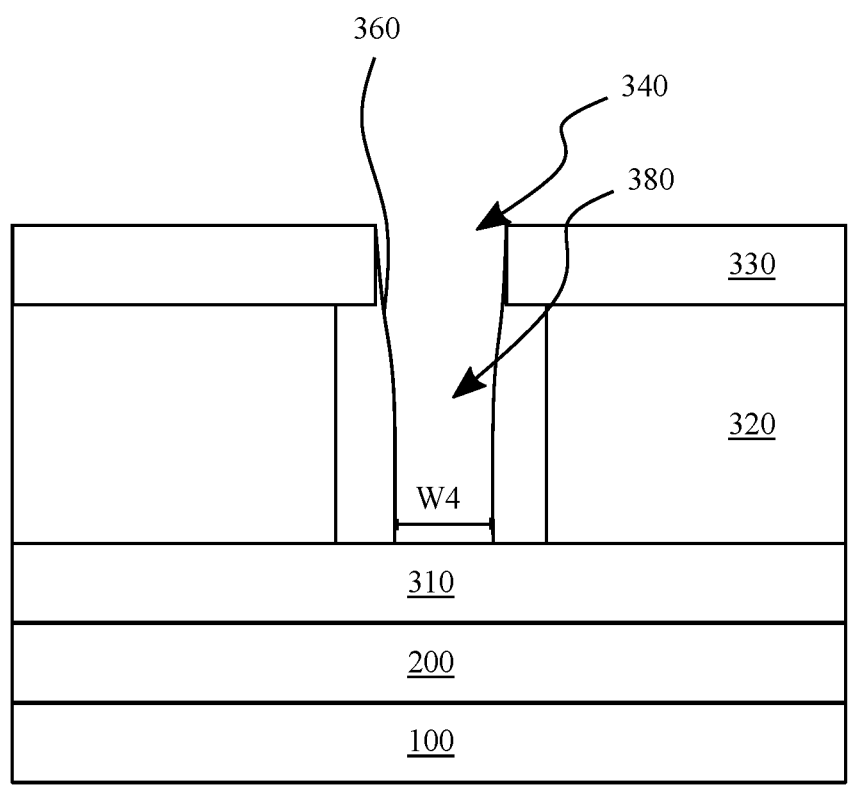

In FIG. 10, the conformal layer 360 is etched with an anisotropic etch to form a transfer aperture 380 through the pore 370 exposing an upper surface of the transfer layer 310. As the pore 370 is free of material, anisotropically etching the conformal layer 360 may transfer a shape of the pore 370 onto the transfer layer 310. In other words, a contour of the exposed portion of the upper surface of the transfer layer 310 may correspond to a contour of the pore 370. Hence, a width W4 of exposed portion of the upper surface of the transfer layer 310 may correspond to the width W3 of the pore 370.

Figure 11:
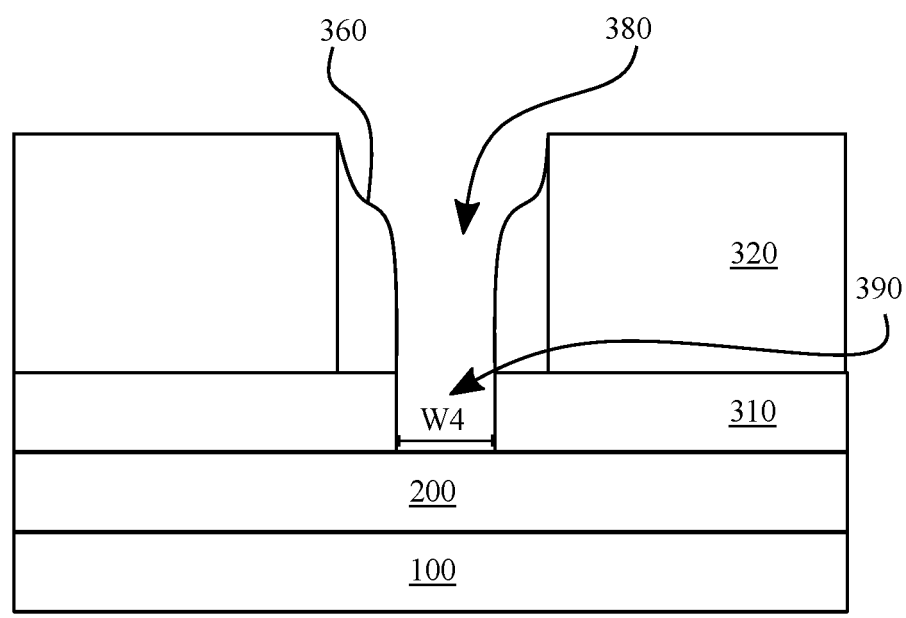

In FIG. 11 a second opening 390 is formed in the transfer layer 310 using the pore 370. The second opening 390 may be formed by anisotropically etching the transfer layer 310 through the transfer aperture 380. In some examples, the conformal layer 360 and the transfer layer 310 are etched consecutively with an anisotropic etch to transfer a contour of the pore 370 onto the transfer layer 310 and to form the second opening 390 in the transfer layer 310 having a contour corresponding to the contour of the pore 370.

As illustrated in FIG. 11 etching the transfer layer 310 may partially or fully remove the patterning layer 330. However, the conformal layer 360, the transfer layer 310 and the patterning layer 330 may also be etched with a common etchant or the patterning layer 330 may persist through forming the second opening 390.

As further illustrated in FIG. 11, forming the second opening 390 may expose the magnetic tunnel junction (MTJ) layer stack 200 through the second opening 390. In some examples, the conformal layer 360 and the transfer layer 310 are consecutively etched to transfer a contour of the pore 370 onto an upper surface of the MTJ layer stack 200.

Figure 12A:
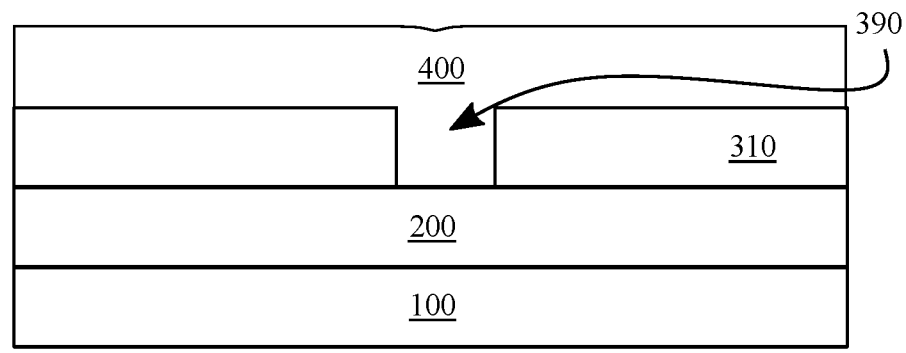
Figure 12B:
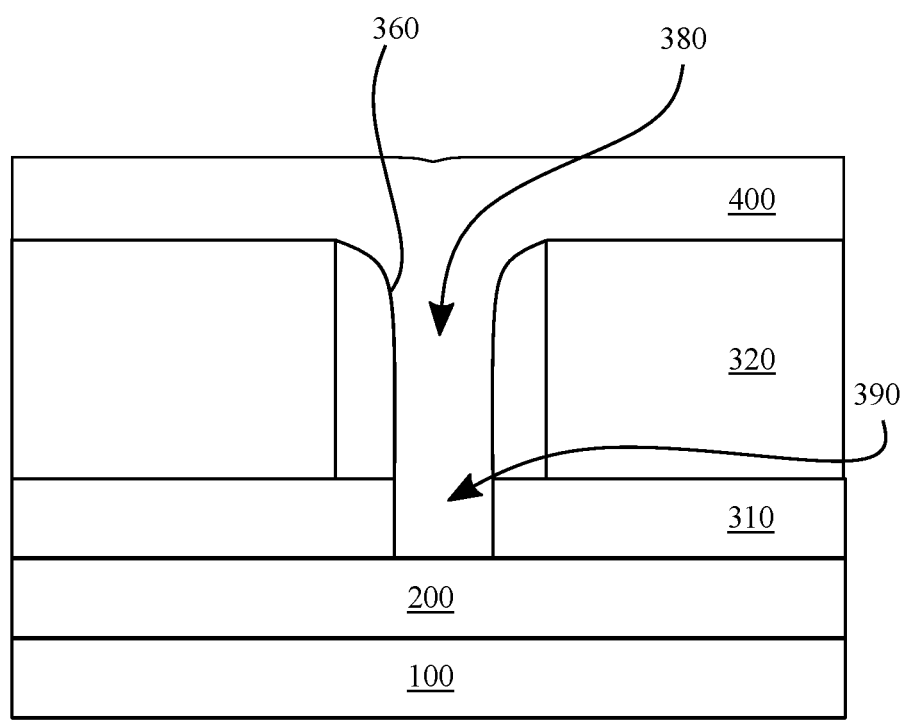
Figure 12C:
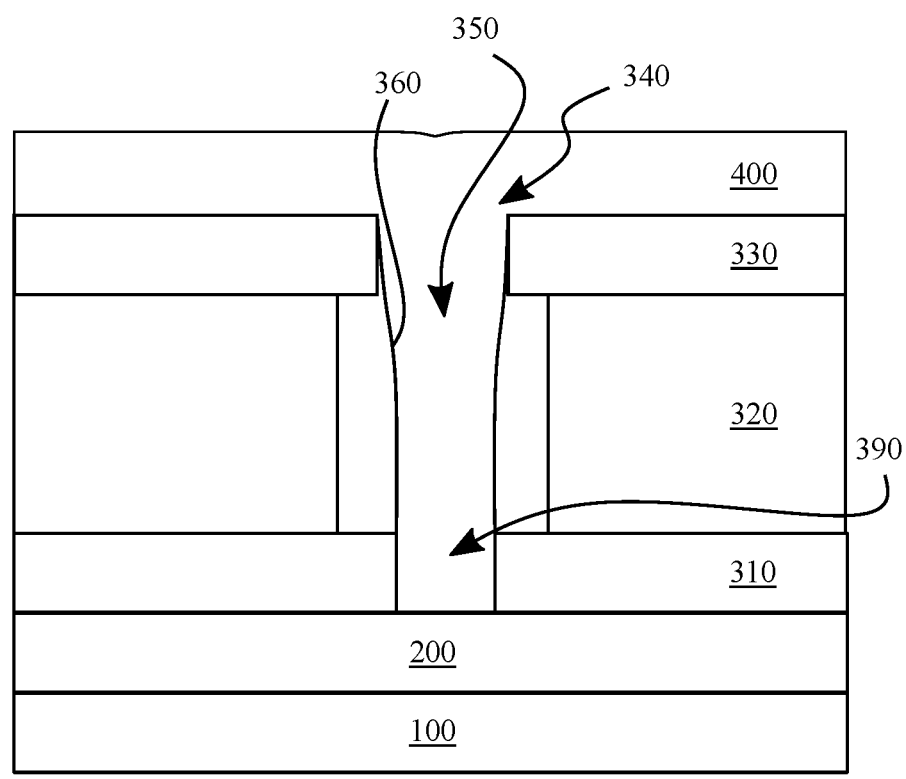

In FIGS. 12A-C a hard mask layer 400 is deposited in the second opening 390. In FIG. 12A, remaining material of the conformal layer 360 and the interlayer 320 is removed prior to depositing the hard mask layer 400 in the second opening 390. FIG. 12B shows an alternative example, wherein the conformal layer 360 and the interlayer 320 are not removed prior to depositing the hard mask layer 400, and the hard mask layer 400 is instead deposited in the second opening 390 and in the transfer aperture 380. FIG. 12C shows a further example, wherein the patterning layer 330, the conformal layer 360 and the interlayer 320 are not removed prior to depositing the hard mask layer 400, and the hard mask layer 400 is instead deposited in the second opening 390, in the transfer aperture 380, and over the patterning layer 330.

The hard mask layer 400 may comprise any hard mask material such as titanium nitride, tantalum nitride, or the like. In some examples, the hard mask layer 400 may be made of a composition which includes tantalum, tungsten, chromium, ruthenium, molybdenum, silicon, germanium, other MRAM compatible metals, or combinations thereof, or including nitrides and/or oxides of these materials. For example, the hard mask layer 400 may comprise a conductive composition of MRAM compatible metals, e.g. a non-magnetic or refractory metal or metal compound, such as tungsten or tantalum, to conductively cap an underlying MTJ layer stack 200. The material of the hard mask layer 400 should be different from the material of the transfer layer 310. The hard mask layer 400 may be formed using any suitable process, for example, by PVD, DC PVD, RF PVD, CVD, ALD, pulse DC, or the like, to fill the second opening 390.

Figure 13:
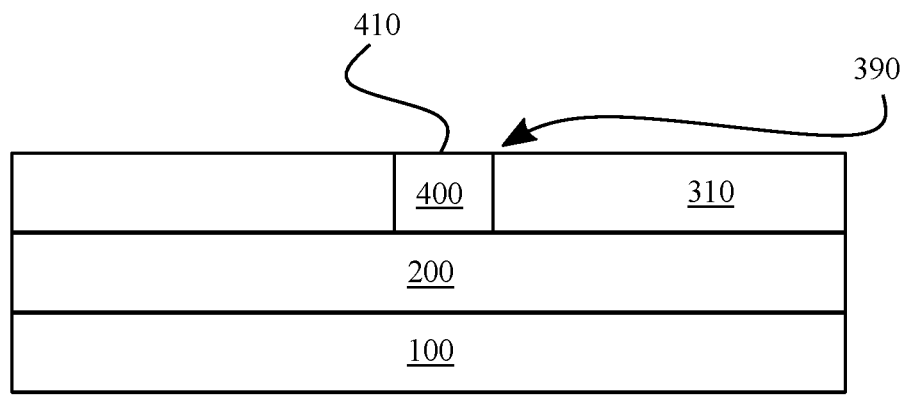

In FIG. 13 a planarization process is performed to remove portions of the hard mask layer 400 to expose the transfer layer 310 and to form a hard mask 410 having a shape corresponding to the second opening 390 in the transfer layer 310. In case the conformal layer 360 and the interlayer 320 are not removed prior to depositing the hard mask layer 400, e.g. as shown in FIGS. 12B, 12C, the planarization process may also remove remaining material of the conformal layer 360 or the interlayer 320.

For example, a chemical mechanical polishing process may be performed to remove portions of the hard mask layer 400 overlying the transfer layer 310, the interlayer 320, the patterning layer 330 or the conformal layer 360. However, depending on the deposition process used for depositing the hard mask layer 400, an isotropic or an anisotropic etch may also be used to expose the transfer layer 310 and to form a hard mask 410 having a shape corresponding to the second opening 390 in the transfer layer 310. For example, when the hard mask layer 400 is deposited substantially conformally over the transfer layer 310, an anisotropic etch may remove any portions of the hard mask layer 400 overlying the transfer layer 310 before removing all of the hard mask material in the second opening 390.

In FIG. 13, the second opening 390 and the corresponding hard mask 410 feature substantial perpendicular sidewalls with respect to substrate 100, such that a contour defined through the pore 370 onto the upper surface of the transfer layer 310 is transferred through the second opening 390 onto the upper surface of the MTJ layer stack 200. However, in some examples, the hard mask 410 features an undercut originating from a shape of the transfer aperture 380 or introduced by an etch process for forming the second opening 390 in the transfer layer 310. For example, the hard mask 410 may comprise a tapered lateral surface defining an undercut of the hard mask 410, wherein a taper of the lateral surface corresponds to a taper of the transfer aperture 380 or is derived therefrom. Alternatively or additionally, an etching process of the transfer layer 310 may introduce an undercut in the second opening 390 which may also provide a tapered lateral surface to the hard mask 410.

Figure 14:
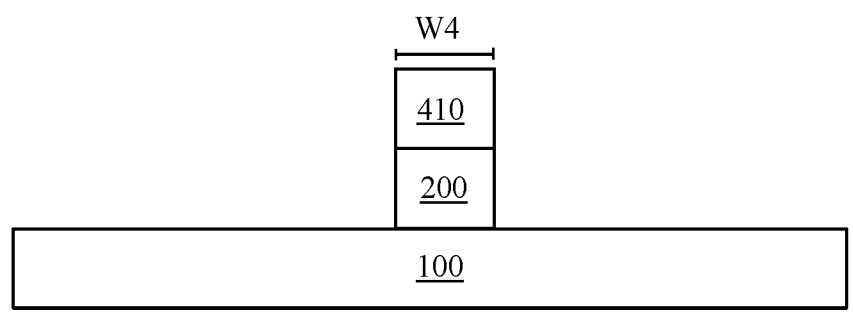

In FIG. 14, the transfer layer 310 is removed and the MTJ layer stack 200 is patterned using the hard mask 410. For example, an anisotropic etching process may be performed to remove the transfer layer 310 and portions of the MTJ layer stack 200 not covered by the hard mask 410. However, the transfer layer 310 may also be first removed using an etchant selective to the transfer layer 310, which may only negligibly etch the hard mask 410, and consecutive anisotropic etching steps may be used to pattern the MTJ layer stack 200 using the hard mask 410. The anisotropic etching steps transfer a contour of the hard mask to the MTJ layer stack 200 and allow forming a pillar-shaped MTJ structure 104 having lateral dimensions defined by the shape of the hard mask 410.

As the width W4 of the hard mask 410 may be largely independent of a dimension defined by the initial lithographic patterning for obtaining the first opening 340, the lateral dimensions of the patterned MTJ layer stack 200 are substantially lithography-variation independent. Instead, the width W4 of the hard mask 410 may depend primarily on the recess depth D introduced by the isotropic etching of the interlayer 320. A variation of the area of the hard mask 410 may thus be controlled by a variation of the etch rate of the interlayer 320 and may be smaller than 6% or smaller than 5%, such as smaller than 3%, as measured by dividing the standard deviation of the area of the hard mask 410 by the mean value of the area of the hard mask 410 for a plurality of hard masks 410 formed concurrently over the substrate 100.

In some examples, the width W4 of the hard mask 410 corresponds to the width W3 of the pore 370 or is derived therefrom. For example, the width W4 of the hard mask 410 may be reduced or increased with respect to the width W3 of the pore 370 due to tapered sidewalls of the transfer aperture 380 or the second opening 390, which may be induced by the anisotropic etch of the conformal layer 360 or the transfer layer 310.

Figure 15:
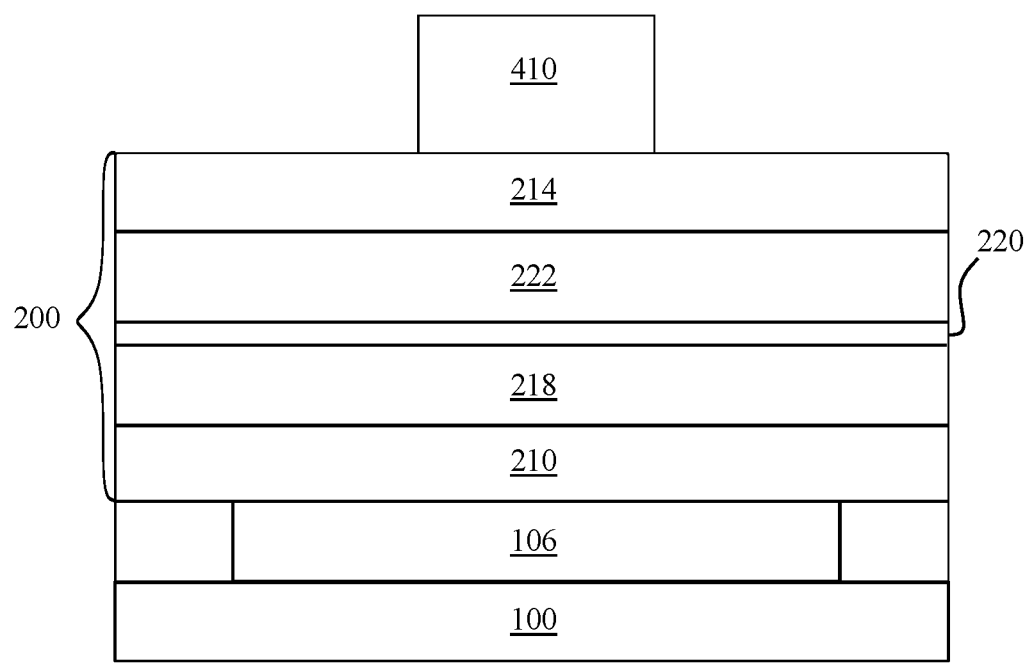
FIGS. 15 through 17 illustrate a series of incremental manufacturing steps as a series of cross-sectional views, complemented by a schematic perspective view in FIG. 16B.
Figure 16A:
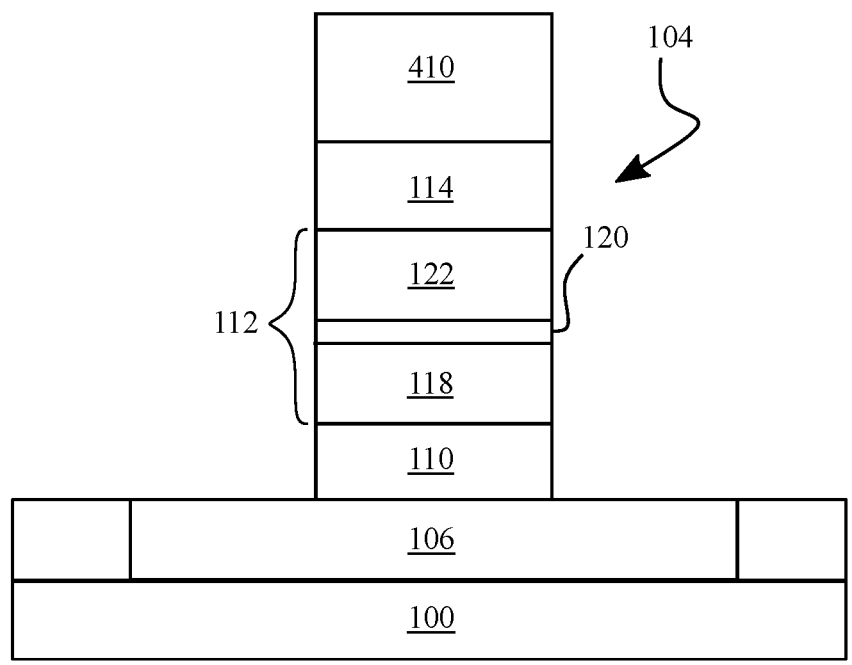
Figure 16B:
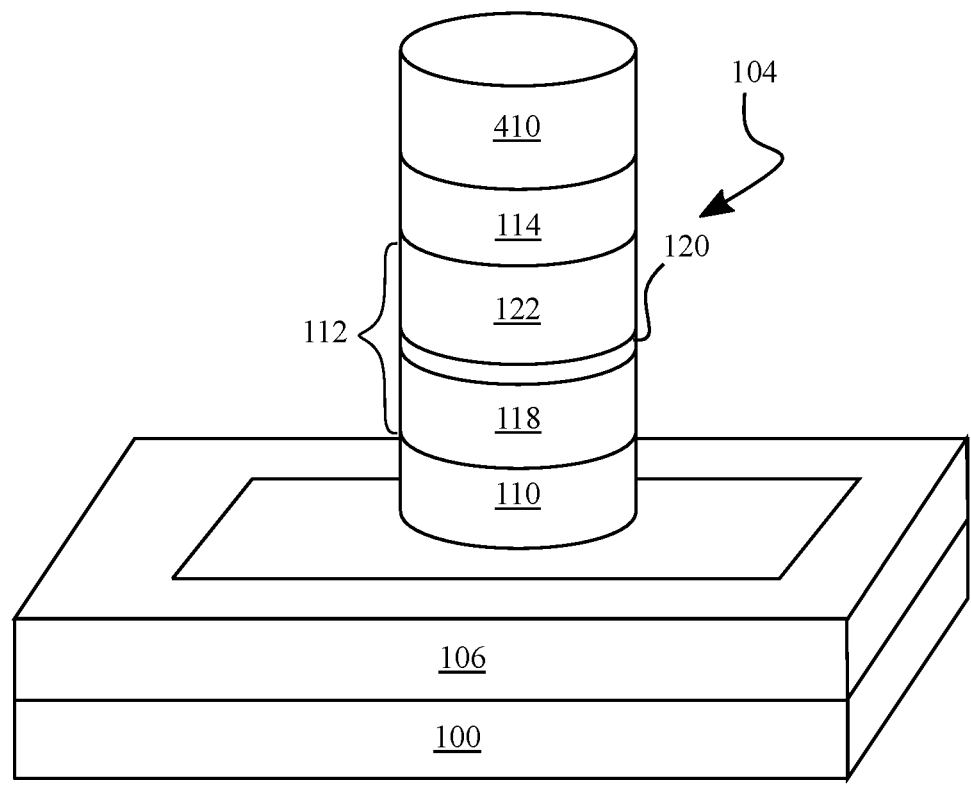
Figure 17:
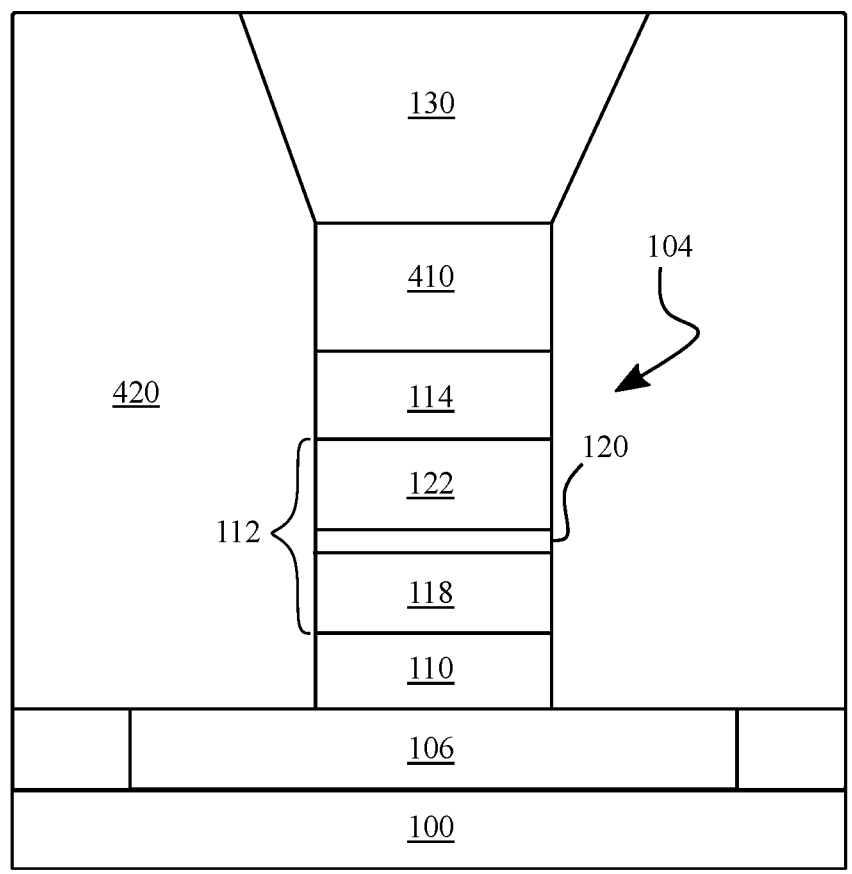

FIGS. 15 through 17 illustrate intermediate stages of the formation of an MTJ structure 104 using the hard mask 410 according to an example. FIGS. 18 through 21 illustrate intermediate stages of the creation of the formation of an MTJ structure 104 using the hard mask 410 according to another example including the intermediate formation of a spacer.

FIG. 15 illustrates a substrate 100 having formed thereon a bottom electrical interconnection layer 106 and an MTJ layer stack 200 formed over the bottom interconnection layer 106. The hard mask 410 defined with a lithography-variation independent formation process as described with reference to FIGS. 3-14 is formed over the MTJ layer stack 200.

The MTJ layer stack 200 comprises a bottom contact layer 210 to contact the bottom electrical interconnection layer 106, a first magnetic interlayer 218 over the bottom contact layer 210, a magnetic tunnel junction barrier layer 220 over the first magnetic interlayer 218 and a top magnetic interlayer 222 over the tunnel junction barrier layer 220. A top contact layer 214 is arranged between the second magnetic interlayer 222 and the hard mask 410.

FIG. 16A illustrates patterning the MTJ layer stack 200 using the hard mask 410. The MTJ layer stack 200 may be patterned using an anisotropic etch to form a pillar-shaped MTJ structure 104 in a portion of the MTJ layer stack 200 covered by the hard mask 410. Thus, a contour of the hard mask 410 is transferred to the tunnel junction barrier layer (220 in FIG. 15) and the magnetic interlayers (218, 222 in FIG. 15) to form a patterned tunnel junction having a contour corresponding to the contour of the hard mask 410, and a variation of the area of the magnetic tunnel junction may thus be smaller than 6% or smaller than 5%, such as smaller than 3%, as measured by dividing the standard deviation of the area of the MTJ stack 112 by the mean value of the area of the MTJ stack 112 for a plurality of pillar-shaped MTJ structures 104 formed concurrently over the substrate 100.

FIG. 16B shows a schematic perspective view of the pillar-shaped MTJ structure 104, wherein the hard mask 410 has a circular contour, and the MTJ structure 104 is accordingly formed pillar-shaped with a contour of the pillar-shaped MTJ structure 104 being circular, such as cone-shaped or circular cylinder-shaped. In some examples, the MTJ structure 104 is formed to feature perpendicular (i.e. out-of-plane) magnetization of the pinned and free magnetic layers 118, 122 on opposite sides of the tunnel junction barrier layer 120. A perpendicular magnetization may not rely on shape anisotropy of the MTJ structure 104 and may thus be combined with a circularly shaped MTJ structure 104.

In FIG. 17, the MTJ structure 104 is covered with or embedded in a dielectric 420 and a top electrode 130 is formed to contact the hard mask 410. In some examples, the hard mask 410 comprises an MRAM compatible metal, such as tungsten or tantalum, and the hard mask 410 may serve as a conductive MTJ cap 116 of the MTJ structure 104. Hence, the MTJ structure 104 may be directly connected with a top electrical interconnection layer 108, 128 via a top electrode 130 contacting the hard mask 410 as shown in FIG. 17. Contacting the MTJ structure 104 via the hard mask 410 reduces interference with the MTJ structure 104 and therefore provides a robust and reliable process to form pillar-shaped MTJ structures 104 with lithography-variation independent critical dimension. However, in some examples, the hard mask 410 may be removed prior to electrically contacting the top contact 114 with the top electrode 130, e.g. in a dual damascene metal interconnect fabrication process.

The dielectric 420 may be an Inter-Metal Dielectric (IMD) or an Inter-Layer Dielectric (ILD), which may include a dielectric material having a low dielectric constant (k value) lower than 3.8, lower than about 3.0, or lower than about 2.5, for example. The insulating material may be formed of PSG, BSG, BPSG, FSG, TEOS, hydrogenated silicon oxycarbide, a carbon-containing low-k dielectric material, HSQ, MSQ, or the like. The top electrode 130 may be formed by any suitable lithography process to pattern the dielectric 420 and to expose the hard mask, and by performing a consecutive metal deposition process, such as by electro-plating, electroless plating, PVD, DC PVD, RF PVD, CVD, ALD, pulse DC, and the like.

Figure 18:
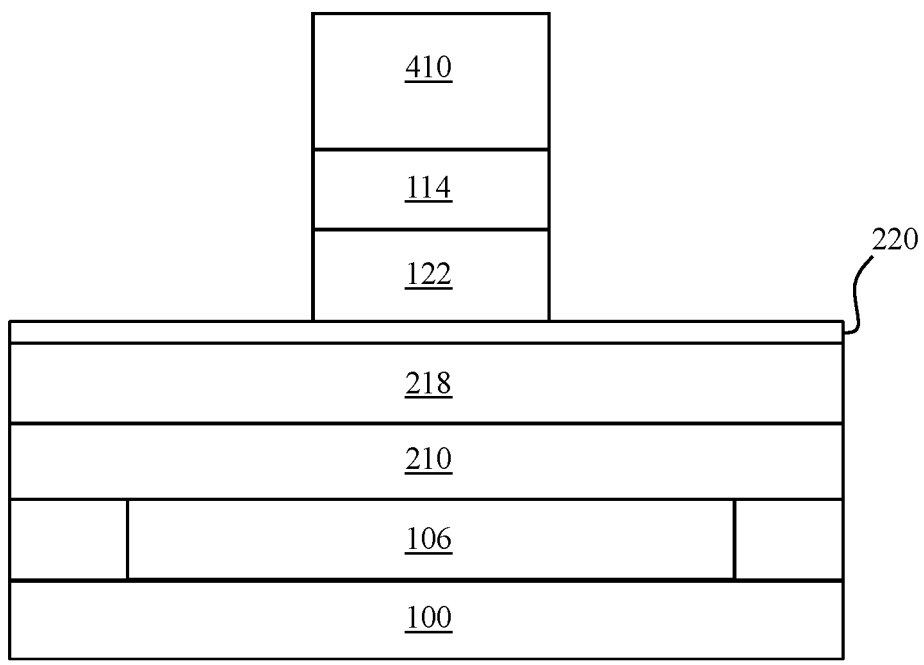
FIGS. 18 through 21 illustrate a series of incremental manufacturing steps as a series of cross-sectional views.

FIG. 18 illustrates another example of an intermediate stage of a process to form an MTJ structure 104 based on the structure depicted in FIG. 15. In FIG. 18, the hard mask 410 is used as the mask for etching an upper portion of the MTJ layer stack 200 over the tunnel junction barrier layer 220, such that an upper surface of the tunnel junction barrier layer 220 is exposed. In other words, FIG. 18 illustrates the result of etching the upper portion of the MTJ layer stack 200 to expose the tunnel junction barrier layer 220. However, in some other examples, the MTJ layer stack 200 is etched to expose an upper surface of a layer adjacent to the tunnel junction barrier layer 220, such as the magnetic interlayer 218.

Figure 19:
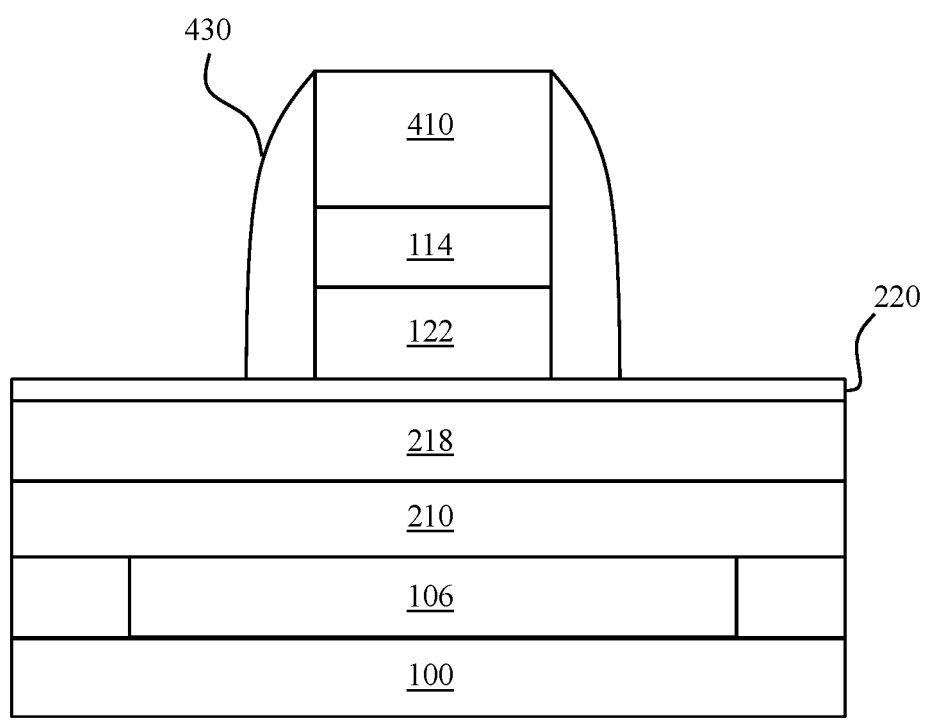

In FIG. 19, insulating sidewall spacers 430 are formed over sidewalls of the upper portion of the MTJ layer stack 200. For example, an insulating material may be conformally deposited over the upper portion of the MTJ layer stack 200, the hard mask 410 and the tunnel junction barrier layer 220, and the resulting structure may be etched with an anisotropic etch to form the insulating sidewall spacers 430. The insulating sidewall spacer 430 may cover the sidewalls of the upper portion of the MTJ layer stack 200 and may protect the upper portion of the MTJ layer stack 200 or may prevent shorting through or shunting out the tunnel junction barrier layer 120 during subsequent processing steps. Note in this case the active tunnel junction area of the magnetic tunnel junction structure determining the magnetoresistive properties of the magnetic tunnel junction would correspond to the area of the upper portion of the MTJ layer stack 200, e.g., the area of the second magnetic interlayer 122, and not to that of the extended barrier layer 220.

Figure 20:
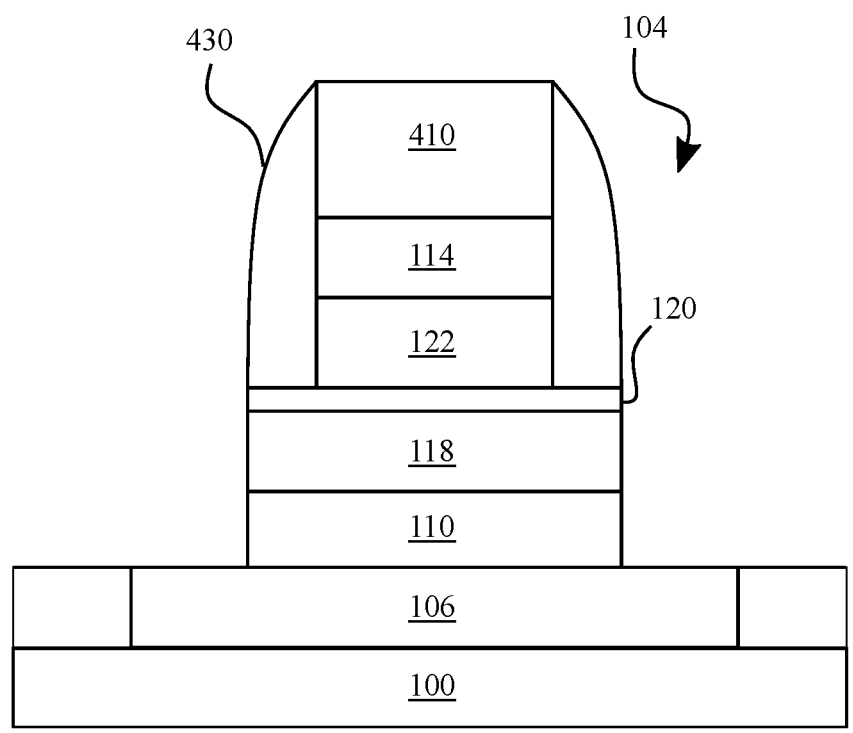

In FIG. 20, the hard mask 410 and the insulating sidewall spacer 430 are used to etch the lower portion of the MTJ layer stack 200 and to form a pillar-shaped MTJ structure 104 in a portion of the MTJ layer stack 200 covered by the hard mask 410 and the insulating sidewall spacer 430. As the active area of the tunnel junction barrier layer 120 largely corresponds to the area covered by the second magnetic interlayer 122, an effective standard deviation of the area of the tunnel junction may then again be smaller than 6% or smaller than 5%, such as smaller than 3%, as measured by dividing the standard deviation of the active area of the magnetic tunnel junction by the mean value of the active area of the magnetic tunnel junction, which is the area of the top magnetic interlayer 122 at the tunnel junction barrier layer 120 in the case of FIG. 20, for a plurality of pillar-shaped MTJ structures 104 formed concurrently over the substrate 100. Those skilled in the art will appreciate that any real system may nonetheless feature a finite effective standard deviation of the area of tunnel junction, such as an effective standard deviation of the tunnel junction greater than 0.1% or greater than 1%.

Further, the circular hard mask 410 may feature a diameter corresponding to the recess depth D of the cavity 350 which can be independent of any photolithographic mask used in a fabrication process, and may thus also have a sub-lithographic dimension, such as being smaller than a photolithographic resolution limit (photo-lithographic critical dimension), e.g. smaller than 60 nm or smaller than 30 nm.

In some examples, the plurality of pillar-shaped MTJ structures 104 are spaced by a photo-lithographic critical dimension, and a ratio between the diameter of the circular hard mask 410 and the distance between adjacent pillar-shaped MTJ structures 104 is between 1/1.5 to 1/10.

The photo-lithographic critical dimension may also be realized in conductive connection features to said pillar-shaped MTJ structures 104, such as a lateral via dimension of a conductive via forming an electrical connection to an upper surface of the MTJ structures 104. For example, the lateral dimension of the top interconnection layer 108 or of a portion of the top electrical interconnection layer 108 may be at or above the photo-lithographic critical dimension, and the diameter of the circular hard mask 410 may be smaller than the photo-lithographic critical dimension.

In some examples, a ratio between the diameter of the circular hard mask 410 and the lateral dimension of the top electrical interconnection layer 108 is between 1/1.5 to 1/10.

Figure 21:
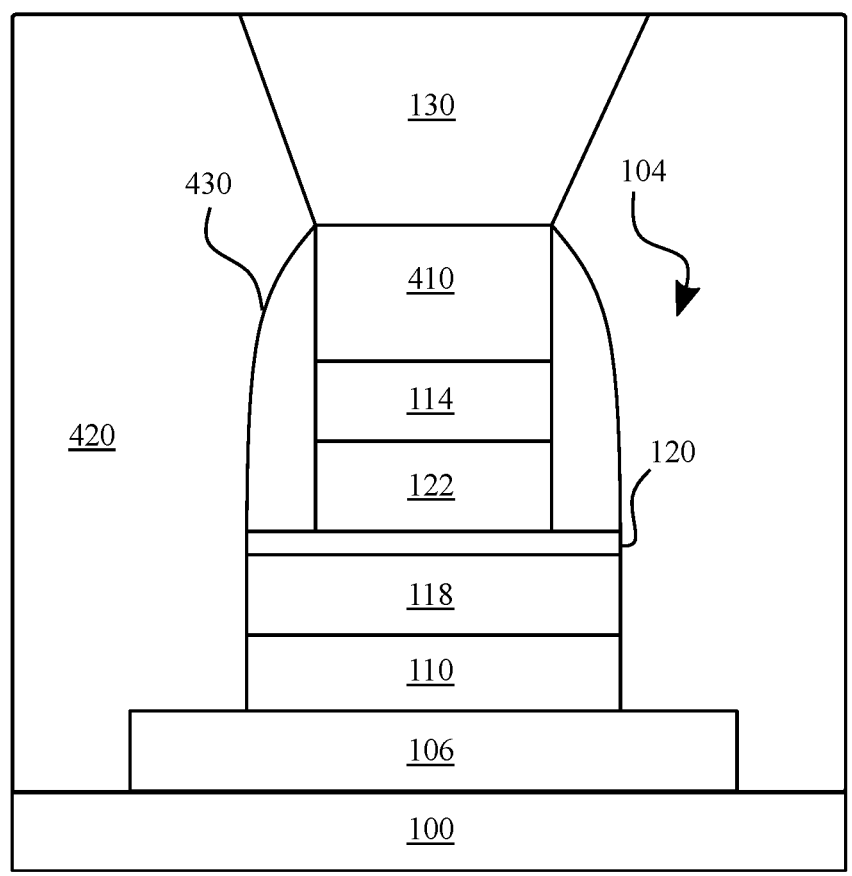

In FIG. 21, the MTJ structure 104 is then covered with or embedded in a dielectric 420 and a top electrode 130 is formed to contact the top portion of the MTJ structure 104 via the hard mask 410. However, in some examples, the hard mask 410 may be removed prior to electrically contacting the top contact 114 with the top electrode 130, or the hard mask 410 may be used as a top electrode.

Figure 22:
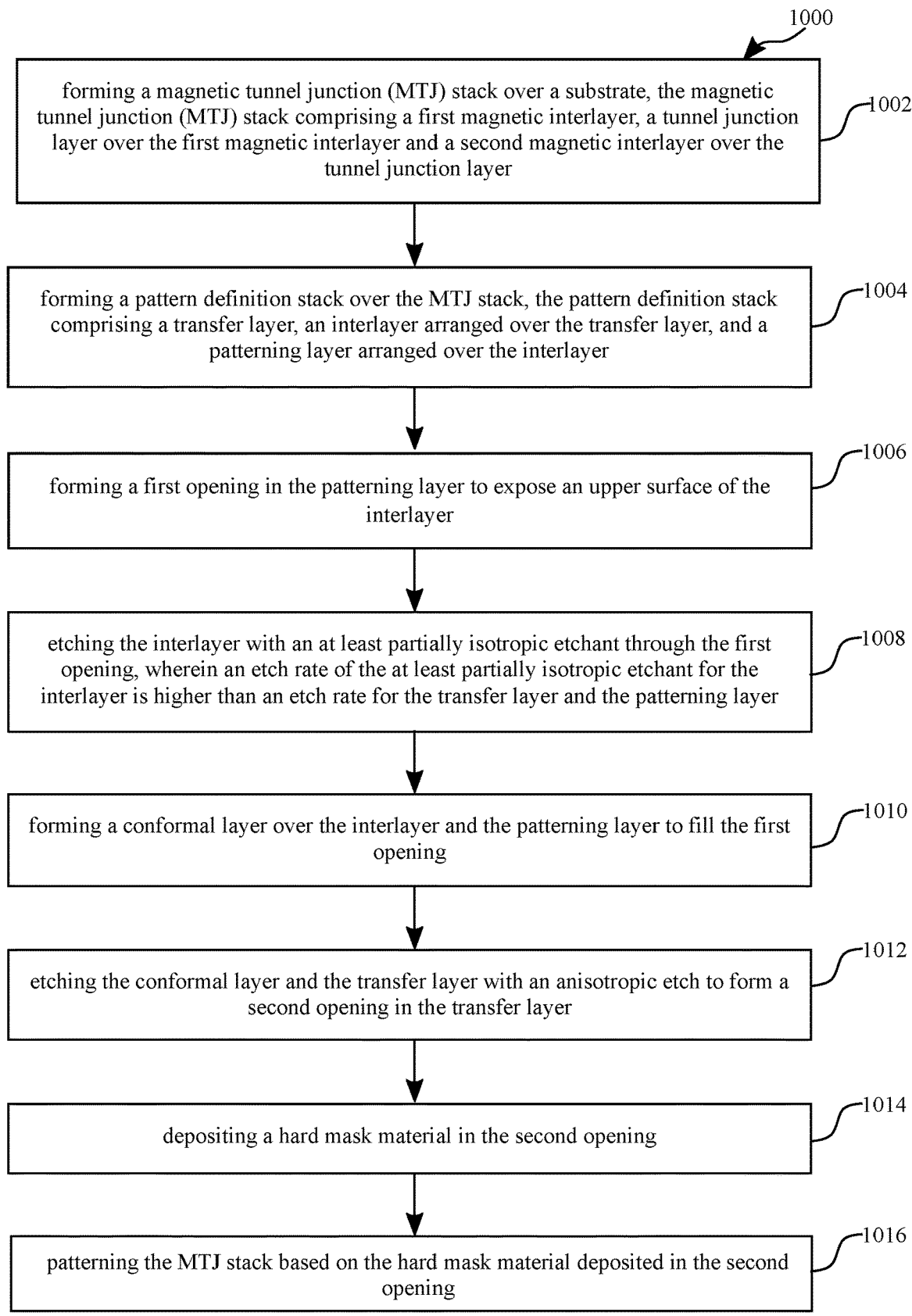
FIG. 22 illustrates a methodology in flowchart format that illustrates some examples of the present concept.

FIG. 22 illustrates a methodology 1000 of forming an MTJ structure 104 for an MRAM magnetic cell 102 in accordance with some examples. Although this method and other methods illustrated and/or described herein are illustrated as a series of steps, acts or events, it will be appreciated that the present disclosure is not limited to the illustrated ordering or acts. Thus, in some examples, the acts may be carried out in different orders than illustrated, and/or may be carried out concurrently. Further, in some examples, the illustrated acts or events may be subdivided into multiple acts or events, which may be carried out at separate times or concurrently with other acts or sub-acts. In some examples, some illustrated acts or events may be omitted, and other un-illustrated acts or events may be included.

Acts 1002 and 1004 can result in, for example, the structure previously illustrated in FIG. 5 in some examples and includes forming a pattern definition stack 300 over an MTJ layer stack 200 on a substrate 100. At 1006, a first opening 340 is formed in the patterning layer 310 of the pattern definition stack 300 as illustrated in FIG. 6 or 7. At 1008, a recessed cavity 350 is formed in the interlayer 320 of the pattern definition stack 300 by anisotropically etching the interlayer 320 with an at least partially isotropic etchant through the first opening 340, wherein the at least partially isotropic etchant selectively etches the interlayer 320 which may result in the example of FIG. 8. At 1010, a conformal layer 360 is formed over the interlayer 320 and the patterning layer 310 to fill the first opening 340 which may result in the example schematically depicted in FIG. 9. At 1012, the conformal layer 360 is etched anisotropically to form a second opening 390 in the transfer layer 310 which may result in the intermediate stages illustrated in FIGS. 10, 11. At 1014, a hard mask material 400 is deposited in the second opening 390 in order to define a critical dimension for the MTJ layer stack 200 which may result in any of the examples of FIGS. 12A-C, to form a hard mask 410 as illustrated in the example of FIG. 13. At 1016, the MTJ stack 200 is patterned using the hard mask material 400 deposited in the second opening 390 to form an MTJ structure 104 which may result in the examples illustrated in FIGS. 14-21.

Some examples relate to a method for forming a semiconductor device. The method comprises forming a pattern definition stack over a substrate, the pattern definition stack comprising a transfer layer, an interlayer arranged over the transfer layer, and a patterning layer arranged over the interlayer. The method further comprises forming a first opening in the patterning layer to expose an upper surface of the interlayer. The method further comprises etching the interlayer with an at least partially isotropic etchant through the first opening, wherein an etch rate of the at least partially isotropic etchant for the interlayer is higher than an etch rate for the transfer layer and the patterning layer. The method further comprises forming a conformal layer over the interlayer and the patterning layer to fill the first opening, and etching the conformal layer and the transfer layer with an anisotropic etch to form a second opening in the transfer layer. The method also comprises depositing a hard mask material in the second opening.

Some examples relate to a method for forming a magnetoresistive random-access memory (MRAM) cell. The method comprises forming a magnetic tunnel junction (MTJ) stack over a substrate, the magnetic tunnel junction (MTJ) stack comprising a first magnetic interlayer, a tunnel junction barrier layer over the first magnetic interlayer and a second magnetic interlayer over the tunnel junction barrier layer. The method further comprises forming a transfer layer over the magnetic tunnel junction stack, forming an interlayer over the transfer layer, forming a patterning layer over an upper surface of the interlayer, and forming a first opening in the patterning layer to expose the upper surface of the interlayer. The method further comprises etching the interlayer with an at least partially isotropic etchant through the first opening, wherein an etch rate of the at least partially isotropic etchant for the interlayer is higher than an etch rate for the transfer layer and the patterning layer to form a recessed cavity in the interlayer. The method further comprises and forming a conformal layer over the interlayer and the patterning layer to fill the first opening and to form a pore in the cavity, and etching the conformal layer and the transfer layer with an anisotropic etch to transfer a lateral dimension of the pore onto the transfer layer and to form a second opening in the transfer layer. The method further comprises depositing a hard mask material in the second opening.

Some examples relate to an integrated circuit. The integrated circuit comprises a semiconductor substrate, a bottom electrode over the substrate, a circular magnetic tunneling junction (MTJ) disposed over an upper surface of bottom electrode, and a circular top electrode disposed over an upper surface of the magnetic tunneling junction. The circular top electrode is concentric to the circular magnetic tunneling junction, and a diameter of the circular magnetic tunneling junction is smaller than 60 nm or smaller than 30 nm.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated examples and/or un-illustrated examples. For example, "a first magnetic layer" described in connection with a first figure may not necessarily correspond to a "first magnetic layer" described in connection with another figure, and may not necessarily correspond to a "first magnetic layer" in an un-illustrated example.

The foregoing outlines features of several examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   forming a pattern definition stack over a substrate, the pattern definition stack comprising a transfer layer, an interlayer arranged over the transfer layer, and a patterning layer arranged over the interlayer;
   forming a first opening in the patterning layer to expose an upper surface of the interlayer;
   etching the interlayer with an at least partially isotropic etchant through the first opening, wherein an etch rate of the at least partially isotropic etchant for the interlayer is higher than an etch rate for the transfer layer and the patterning layer;
   forming a conformal layer over the interlayer and the patterning layer to fill the first opening;
   etching the conformal layer and the transfer layer with an anisotropic etch to form a second opening in the transfer layer; and
   depositing a hard mask material in the second opening.

2. The method according to claim 1, the method further comprising:

anisotropically etching the interlayer through the first opening to form a cylindrical cavity extending into the interlayer before etching the interlayer with the at least partially isotropic etchant.

3. The method according to claim 2, wherein forming the cylindrical cavity exposes an upper surface of the transfer layer.

4. The method according to claim 2, wherein etching the interlayer with the at least partially isotropic etchant recedes a lateral surface of the interlayer in the cylindrical cavity with respect to a lateral surface of the patterning layer in the first opening over a recess depth, and
wherein etching the conformal layer and the transfer layer with an anisotropic etch forms the second opening in the transfer layer having a width corresponding to twice the recess depth.

5. The method according to claim 1, wherein forming the conformal layer over the interlayer and the patterning layer forms a pore arranged between an upper surface of the patterning layer and an upper surface of the transfer layer, the pore comprising a cylindrical pore segment; and wherein the method further comprises:
etching the transfer layer with the anisotropic etch to form the second opening in the transfer layer, a contour of the second opening corresponding to a contour of the cylindrical pore segment.

6. The method according to claim 5, wherein etching the conformal layer and the transfer layer with an anisotropic etch to form the second opening comprises:
etching the conformal layer to expose an upper surface of the transfer layer corresponding to the contour of the cylindrical pore segment.

7. The method according to claim 1, wherein a thickness of the interlayer in the pattern definition stack is larger than a width of the second opening.

8. The method according to claim 1, the method further comprising:
forming a magnetic tunnel junction (MTJ) stack over the substrate, the magnetic tunnel junction stack comprising a magnetic tunnel junction barrier layer;
and wherein the pattern definition stack is formed over the magnetic tunnel junction stack.

9. The method according to claim 8, the method further comprising:
exposing the magnetic tunnel junction (MTJ) stack through the second opening before depositing the hard mask material.

10. The method according to claim 1, wherein the hard mask material is a metallic material.

11. The method according to claim 1, wherein the hard mask material comprises tungsten (W) or tantalum (Ta).

12. The method according to claim 1, the method further comprising:
performing a planarization process after depositing the hard mask material in the second opening to form a hard mask in the second opening comprising the hard mask material.

13. A method for forming a magnetoresistive random-access memory (MRAM) cell, the method comprising:
forming a magnetic tunnel junction (MTJ) stack over a substrate, the magnetic tunnel junction (MTJ) stack comprising a first magnetic interlayer, a tunnel junction barrier layer over the first magnetic interlayer and a second magnetic interlayer over the tunnel junction barrier layer;
forming a transfer layer over the magnetic tunnel junction stack;
forming an interlayer over the transfer layer;
forming a patterning layer over an upper surface of the interlayer;
forming a first opening in the patterning layer to expose the upper surface of the interlayer;
etching the interlayer with an at least partially isotropic etchant through the first opening, wherein an etch rate of the at least partially isotropic etchant for the interlayer is higher than an etch rate for the transfer layer and the patterning layer to form a recessed cavity in the interlayer;
forming a conformal layer over the interlayer and the patterning layer to fill the first opening and to form a pore in the recessed cavity;
etching the conformal layer and the transfer layer with an anisotropic etch to transfer a lateral dimension of the pore onto the transfer layer and to form a second opening in the transfer layer;
depositing a hard mask material in the second opening.

14. The method according to claim 13, wherein forming the magnetic tunnel junction stack comprises:
forming a bottom contact layer over the substrate;
forming the first magnetic interlayer over the bottom contact layer;
forming the tunnel junction barrier layer over the first magnetic interlayer;
forming the second magnetic interlayer over the tunnel junction barrier layer;
forming a top contact layer over the second magnetic interlayer.

15. The method according to claim 14, further comprising forming a spin orbit torque material layer over the substrate; and
forming the first magnetic interlayer over the spin orbit torque material layer.

16. The method according to claim 13, wherein the method further comprises:
etching the transfer layer to form a hard mask comprising the hard mask material; and
anisotropically etching the magnetic tunnel junction stack to form a magnetic tunnel junction structure.

17. The method according to claim 13, wherein anisotropically etching the magnetic tunnel junction stack to form an MTJ structure comprises
anisotropically etching the second magnetic interlayer to expose the tunnel junction barrier layer;
forming a conformal spacer layer over sidewalls of the second magnetic interlayer.

18. A method, comprising:
receiving a semiconductor substrate;
forming a bottom electrode over the semiconductor substrate;
forming a magnetic tunneling junction (MTJ) disposed over an upper surface of the bottom electrode; and
forming a circular top electrode disposed over an upper surface of the MTJ;
wherein a sidewall of the circular top electrode comprises a tapered lateral surface defining an undercut of the circular top electrode, such that a top surface of the circular top electrode has a first diameter and a lower portion of the circular top electrode corresponding to the undercut and corresponding to a top surface of the MTJ has a second diameter that is smaller than 60 nm or smaller than 30 nm.

19. The method of claim 18, wherein the MTJ comprises a first magnetic interlayer and a second magnetic interlayer separated by a MTJ barrier layer, and the MTJ barrier layer comprises magnesium oxide, aluminum oxide, NiO, GdO, Ta2O5, MoO2, TiO2, or WO2.

20. The method of claim 18, wherein forming the MTJ comprises:
- forming a transfer layer over an MTJ stack;
- forming an interlayer over the transfer layer;
- forming a patterning layer over an upper surface of the interlayer;
- forming a first opening in the patterning layer to expose the upper surface of the interlayer;
- etching the interlayer with an at least partially isotropic etchant through the first opening, wherein an etch rate of the at least partially isotropic etchant for the interlayer is higher than an etch rate for the transfer layer and the patterning layer to form a recessed cavity in the interlayer;
- forming a conformal layer over the interlayer and the patterning layer to fill the first opening and to form a pore in the recessed cavity;
- etching the conformal layer and the transfer layer with an anisotropic etch to transfer a lateral dimension of the pore onto the transfer layer and to form a second opening in the transfer layer;
- depositing a hard mask material in the second opening, wherein an outer perimeter of the hard mask material has the second diameter.

\* \* \* \* \*